(12) United States Patent
Sakamoto et al.

(10) Patent No.: US 6,545,364 B2
(45) Date of Patent: Apr. 8, 2003

(54) CIRCUIT DEVICE AND METHOD OF MANUFACTURING THE SAME

(75) Inventors: Noriaki Sakamoto, Gunma (JP); Yoshiyuki Kobayashi, Gunma (JP); Junji Sakamoto, Gunma (JP); Shigeaki Mashimo, Gunma (JP); Katsumi Okawa, Gunma (JP); Eiju Maehara, Gunma (JP); Kouji Takahashi, Gunma (JP); Hirokazu Fukuda, Gunma (JP); Hiroki Etou, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/810,110

(22) Filed: Mar. 16, 2001

(65) Prior Publication Data

US 2002/0027276 A1 Mar. 7, 2002

(30) Foreign Application Priority Data

Sep. 4, 2000 (JP) ........................ 2000-266685
Sep. 4, 2000 (JP) ........................ 2000-266710

(51) Int. Cl.[7] ........................ H01L 23/48; H01L 23/52; H01L 29/40

(52) U.S. Cl. ........................ 257/773; 257/678; 257/690; 257/692; 257/698; 257/774

(58) Field of Search ........................ 257/773, 678, 257/690, 692, 774, 698

(56) References Cited

U.S. PATENT DOCUMENTS 6,307,272 B1 * 10/2001 Takahashi et al. .......... 257/787
6,313,520 B1 * 11/2001 Yoshida et al. ............. 257/676

* cited by examiner

Primary Examiner—David Nelms
Assistant Examiner—Tu-Tu Ho
(74) Attorney, Agent, or Firm—Fish & Richardson PC

(57) ABSTRACT

After a trench 54 is formed in a conductive foil 60, a circuit element is mounted in a flip chip method. Then, an insulating resin 50 is covered on the conductive foil 60 as a support substrate. After reversion, the conductive foil 60 is polished over the insulating resin 50 as a support substrate at this time to separate the conductive paths. Accordingly, a circuit device having the conductive paths 51 and the circuit elements 52 supported by the insulating resin 50 can be produced without employing the support substrate.

10 Claims, 23 Drawing Sheets

FIG.33

| | | frame | pre-form | connection configuration | electrode on the chip surface | $R_{DS}(on)$, $V_{GS}=4V$ (mΩ) | remarks |
|---|---|---|---|---|---|---|---|
| conventional | A | cupper | solder | Au wire:4 short wires | Al | 13.43 | 4 short wires (source side) |
| | B | cupper | solder | Au wire:conventional | Al | 12.10 | 2 long and 2 short wires (source side) |
| present invention | C | cupper | solder | Cu/solder | Aubump | 8.67 | wireless (reference of wireless configuration) |
| | D | cupper | silver paste | Cu/Ag paste | Aubump | 8.74 | effect of the Ag paste |

Material Characteristics (volume resistance coefficient $\rho$)

| | |
|---|---|
| frame (Cu) | $5.74 \times 10^{-6}$ Ω·cm |
| Au wire | $2.4 \times 10^{-6}$ Ω·cm |
| solder (Pb/5Sn/2.5Ag) | $1.95 \times 10^{-5}$ Ω·cm |
| Ag paste | $1.0 \times 10^{-4}$ Ω·cm |

CIRCUIT DEVICE AND METHOD OF MANUFACTURING THE SAME

BACKGROUND OF THE INVENTION

1. Field Of the Invention

The present invention relates to a circuit device and a method of manufacturing the circuit device, and particularly to a thin type circuit device and a manufacturing method of the circuit device which eliminates the need of a support substrate.

2. Description of the Related Art

Conventionally, the circuit device that is set on the electronic equipment is demanded to be smaller, thinner, and lighter, so that it can be employed in the portable telephones or the portable computers.

For example, the semiconductor devices as the circuit device are typically of the package type which is conventionally sealed by normal transfer molding. This semiconductor device is mounted on a printed circuit board PS as shown in FIG. 29.

This package type semiconductor device has a semiconductor chip 2 covered with a resin layer 3, and a lead terminal 4 for outside connection derived from a side portion of this resin layer 3.

However, this package type semiconductor device 1 with the lead terminal 4 extending out of the side face of the resin layer 3 was too large in whole size to satisfy the requirements of smaller, thinner and lighter constitution.

Therefore, the companies have developed various structures to realize the smaller, thinner and lighter semiconductor devices, and recently, what is called a CSP (Chip Size Package) has been developed, including a wafer scale CSP as large as the chip size or a CSP slightly larger than the chip size.

FIG. 30 shows a CSP 6 that uses a glass epoxy substrate 5 as the support substrate and is slightly larger than the chip size. Herein, a transistor chip T is mounted on the glass epoxy substrate 5.

A first electrode 7, a second electrode 8, and a die pad 9 are formed on the surface of this glass epoxy substrate 5, and a first back electrode 10 and a second back electrode 11 are formed on a back surface thereof. And the first electrode 7 and the first back electrode 10, as well as the second electrode 8 and the second back electrode 11 are electrically connected via a through hole TH. Also, the bare transistor chip T is fixed on the die pad 9, in which an emitter electrode of the transistor is connected with the first electrode 7 via a bonding wire 12, and a base electrode of the transistor is connected with the second electrode 8 via the bonding wire 12. Further, a resin layer 13 is provided on the glass epoxy substrate 5 to cover the transistor chip T.

The CSP 6 employs the glass epoxy substrate 5, but has a simple structure extending from the chip T to the back electrodes 10, 11 for outside connection, unlike the wafer scale CSP, with a merit of low manufacturing costs.

The CSP 6 is mounted on the printed circuit board PS, as shown in FIG. 29. The printed circuit board PS is provided with the electrodes and interconnects making up an electrical circuit, to which the CSP 6, the package type semiconductor device 1, a chip resistor CR and a chip condenser CC are electrically connected and fixed.

A circuit constituted by this printed circuit board is installed on various sets.

Referring now to FIGS. 31 and 32, a manufacturing method of this CSP will be described below. In FIG. 32, a flowchart entitled as a glass epoxy/flexible substrate in the center is referred to.

First of all, a glass epoxy substrate 5 as the base substance (support substrate) is prepared. The Cu foils 20, 21 are bonded via an insulating adhesive on the both sides (see FIG. 31A).

Subsequently, Cu foil 20, 21 corresponding to the first electrode 7, the second electrode 8, the die pad 9, the first back electrode 10, the second back electrode 11, are covered with an anti-etching resist 22, and then the Cu foils 20, 21 are patterned. The patterning may be performed separately on the front and back sides (see FIG. 31B).

Subsequently, a pore for the through hole TH is formed through the glass epoxy substrate, using a drill or laser. Then, this pore is plated to make the through hole TH. Via this through hole TH, the first electrode 7 and the first back electrode 10, as well as the second electrode 8 and the second back electrode 11 are electrically connected (see FIG. 31C).

Further, though omitted in the drawings, the first electrode 7 and the second electrode 8 which become the bonding posts are plated with Au, and the die pad 9 which becomes a die bonding post is plated with Au to make die bonding of the transistor chip T.

Lastly, the emitter electrode of the transistor chip T and the first electrode 7, as well as the base electrode of the transistor chip T and the second electrode 8 are connected via the bonding wire 12, and covered with the resin layer 13 (see FIG. 31D).

As required, the individual electrical elements are divided by dicing. In FIG. 31, the glass epoxy substrate 5 is only provided with one transistor chip T, but practically, a number of transistor chips T may be provided like a matrix. Therefore, the electrical elements are separated individually by a dicing apparatus lastly.

With the above manufacturing method, the CSP type electrical element employing the support substrate 5 can be completed. This manufacturing method is also applicable to the case of employing a flexible sheet as the support substrate.

On the other hand, a manufacturing method employing a ceramic substrate is shown in a flowchart to the left of FIG. 32. After the ceramic substrate to make the support substrate is prepared, a through hole is formed. Then the front and back electrodes are printed using a conductive paste, and sintered. Thereafter, the steps are performed in the same way as the manufacturing method of FIG. 31 up to covering the resin layer in the previous manufacturing method. However, the ceramic substrate has the problem that it is very fragile, and easily breaks off, unlike the flexible sheet or glass epoxy substrate, and can not be molded using a mold. Therefore, the sealing resin is potted, cured, and then polished to make a flat surface. Lastly, the electrical elements are separated using a dicing apparatus.

Further there is a demand for a lithium ion cell of small size and large capacity with the spread of portable terminals. A protection circuit substrate for battery management of charging or discharging this lithium ion cell must be small in size and withstand the short-circuit with the load, owing to the needs for the lighter portable terminal. Such protection circuit substrate is accommodated within a container of the lithium ion cell, and required to be smaller and thinner. For this purpose, the COB (Chip on Board) technology making use of a lot of chip components was freely employed to meet the demands for the smaller and thinner constitution. On the other hand, since a switching element is connected in series with the lithium ion cell, the on resistance of this switching element needs to be suppressed to a quite small value, which is an essential factor to lengthen the service time or stand-by time in the portable telephone.

In order to implement this small on resistance (RDS (on)), the chips with increased cell density were developed by using minute processing in manufacturing the chips.

More specifically, a planar structure in which the channels are formed on the surface of semiconductor substrate had a cell density of 7,400,000 cells/square inches, and an on resistance of 27 mΩ. However, in the first generation of trench structure in which channels are formed on the side face of trench, the cell density was greatly increased to 25,000,000 cells/square inches, and the on resistance was decreased to 17 mΩ. Further, in the second generation of trench structure, the cell density was 72,000,000 cells/square inches, and the on resistance was decreased to 12 mΩ. However, there are some limitations on the minute structure to further decrease the on resistance.

FIG. 34 is a cross-sectional view of a power MOSFET that is mounted on the protection circuit substrate. There is a blanking frame made of copper, and a power MOSFET bare chip 3 is fixed by a preform material 2 made of solder or silver paste on a header 1 of this frame. On a lower surface of the power MOSFET bare chip 3, a drain electrode is formed by deposition of gold (not shown). A gate electrode and a source electrode are formed by deposition of aluminum on an upper surface thereof. A drain terminal 5 of the frame is connected to the header 1, and directly connected to the drain electrode. The gate electrode and the source electrode are electrically connected to a gate terminal and a source terminal 7, using a gold bonding fine wire 4. Accordingly, to decrease the on resistance, it is important that the resistance of the frame material, the preform material, the material of bonding fine wire 4, and the electrode material of source electrode on the upper face of chip has also effects on the on resistance of the power MOSFET.

FIGS. 35 and 36 are plan views for explaining the prior art in which the bonding fine wire is devised to decrease the on resistance.

FIG. 35 is a view illustrating four bonding fine wire 4 for connecting the source electrode with the source terminal 7 to improve the current capacity. FIG. 36 is a view illustrating the bonding fine wires 4 for connecting the source electrode with the source terminal 7, two short wires and two long wires, to improve the current capacity, and further to decrease the resistance of the source electrode by broadening the bonding region on the source electrode.

FIG. 33 is a table showing the differences of the on resistance depending on the mounting structure of the conventional power MOSFET. Sample A and sample B is concerned with the molding structure with the conventional SOP8 outer shape, sample A corresponding to a structure of FIG. 35 and sample B corresponding to that of FIG. 36. Instead of the four bonding fine wires, in a combination of two short fine wires and two long fine wires, the on resistance is decreased by 1.33 Ωm from 13.43 mΩ to 12.10 mΩ, as shown in the table.

In FIG. 30, the transistor chip T, the connecting means 7 to 12, and the resin layer 13 are required components for the electrical connection with the outside and the protection of the transistor. However, these components were so insufficient that it was difficult to fabricate an electrical circuit element that can realize the smaller, thinner and lighter constitution.

The glass epoxy substrate 5 that becomes the support substrate is unnecessary in essence, as previously described. However, in the manufacturing method, because the electrodes are pasted together, the glass epoxy substrate 5 is employed as the support substrate and is not unnecessary.

Therefore, this glass epoxy substrate 5 is used, which increases the costs. Further, because the glass epoxy substrate 5 is thick, the circuit element is thickened, imposing some limitations on the smaller, thinner and lighter constitution.

Further, a though hole formation process for connecting the electrodes on the both sides is requisite in the glass epoxy substrate or ceramic substrate, leading to the problem that the manufacturing process is lengthened.

Further, the bonding wire 12 is connected by drawing a loop, which also impedes the realization of the thinner constitution.

Further, at present, the portable terminals have been demanded to be smaller in size and lighter in weight, and have a longer life of service time of the self-contained battery. Among others, there is the problem that any effective solving means to implement the low on resistance has not yet been found by doing away with the power MOSFET mounting structure and the assembling method.

A manufacturing method of assembling the power MOSFET with one sheet of frame has been conventionally established, but the leading out of the electrode on the upper face of the semiconductor chip is made by wire bonding. Also, there is the problem that any solving means has not been found to improve the on resistance of the power MOSFET in consideration of leading out the source electrode that is a current passing electrode on the upper face of semiconductor chip with the most significant effect.

Further, the above method of assembling the conventional power MOSFET with one sheet of frame employs the bonding wire. Hence, there is the problem that the molding resin is made thicker by a loop height of the bonding wire, which impedes the thinner structure.

SUMMARY OF THE INVENTION

The present invention has been achieved in the light of the above-mentioned problems, and intends to obtain a thin and reliable semiconductor device.

Firstly the invention provides a circuit device comprising a plurality of conductive paths that are electrically isolated, a circuit element having a front electrode fixed on a desired conductive path, a metal connecting plate for connecting a back electrode of said circuit element with a desired conductive path, and an insulating resin for covering said circuit element and integrally supporting said conductive paths. Hence, only minimum amount of components can be employed to solve the conventional problems.

Secondly, the invention provides a circuit device comprising a plurality of conductive paths that are electrically isolated by a trench, a circuit element having a front electrode fixed on a desired conductive path, a metal connecting plate for connecting a back electrode of said circuit element with a desired conductive path, and an insulating resin for covering said circuit element and being filled in said trench between said conductive paths to integrally support said conductive paths. Hence, a plurality of conductive paths are integrally supported by the insulating resin being filled in the trench to solve the conventional problems.

Thirdly, the invention provides a circuit device comprising a plurality of conductive paths that are electrically isolated by a trench, a circuit element having a front electrode fixed on a desired conductive path, a metal connecting plate for connecting a back electrode of said circuit element with a desired conductive path, and an insulating resin for covering said circuit elements and being filled in said trench between said conductive paths to integrally support said conductive paths, with only the back face of said conductive paths exposed. Hence, the through hole for electrical connection with the back face of the conductive paths can be eliminated to solve the conventional problems.

Fourthly, the invention provides a method of manufacturing the circuit devices comprising the steps of forming the conductive paths in such a way as to prepare a conductive foil, and to form a trench shallower than the thickness of said conductive foil in said conductive foil except for at least an area that becomes a conductive path, fixing a front electrode of a circuit element on a desired conductive path, connecting a back electrode of said circuit element with a desired conductive path via a metal connecting plate, molding an insulating resin to cover said circuit element and be filled in said trench, and removing said conductive foil in a thick portion where said trench is not provided. Hence, the conductive foil to make the conductive paths is a start material, in which the conductive foil has a support function till the insulating resin is molded, and the insulating resin has the support function after molding. Consequently, the support substrate can be dispensed with to solve the conventional problems.

Fifthly, the invention provides a method of manufacturing the circuit devices comprising the steps of forming the conductive paths in such a way as to prepare a conductive foil, and to form a trench shallower than the thickness of said conductive foil in said conductive foil except for at least an area which becomes a conductive path, fixing each front electrode of a plurality of circuit elements on a desired conductive path, connecting each back electrode of said circuit elements with a desired conductive path via a metal connecting plate, molding an insulating resin to cover said plurality of circuit elements and be filled in said trench, removing said conductive foil in a thick portion where said trench is not provided, and severing said insulating resin to separate the circuit devices individually. Hence, a number of circuit devices can be mass-produced to solve the conventional problems.

Sixthly, there is provided a MOSFET mounting structure comprising a plurality of conductive paths that are electrically isolated, a MOSFET chip having a gate electrode and a source electrode fixed on the desired conductive paths, a metal connecting plate for connecting a drain electrode of said MOSFET chip with a desired conductive path, and an insulating resin for covering said MOSFET chip and integrally supporting said conductive paths. Hence, the bonding wire is eliminated and the source electrode is fixed directly to the conductive path, thereby implementing the low on resistance.

Seventhly, there is provided a method of manufacturing the circuit devices comprising the steps of forming the conductive paths in such a way as to prepare a conductive foil, and to form a trench shallower than the thickness of said conductive foil in said conductive foil except for at least an area that becomes a conductive path, fixing a gate electrode and a source electrode of a MOSFET chip on the desired conductive paths, connecting a drain electrode of said MOSFET chip with a desired conductive path via a metal connecting plate, molding an insulating resin to cover said MOSFET chip and be filled in said trench, and removing said conductive foil in a thick portion where said trench is not provided. Hence, the manufacturing method of mass production can be provided in the flip chip method in which the bonding step is eliminated.

BRIEF DESCRIPTION OF THE DRAWINGS

FIG. 33 is a characteristic table for explaining the manufacturing methods of the MOSFET mounting structure of the invention and the conventional MOSFET mounting structure.

DESCRIPTION OF THE PREFERRED EMBODIMENTS

First Embodiment of Circuit Device

A circuit device of the present invention and its structure will be described below with reference to FIG. 1.

Figure 1:
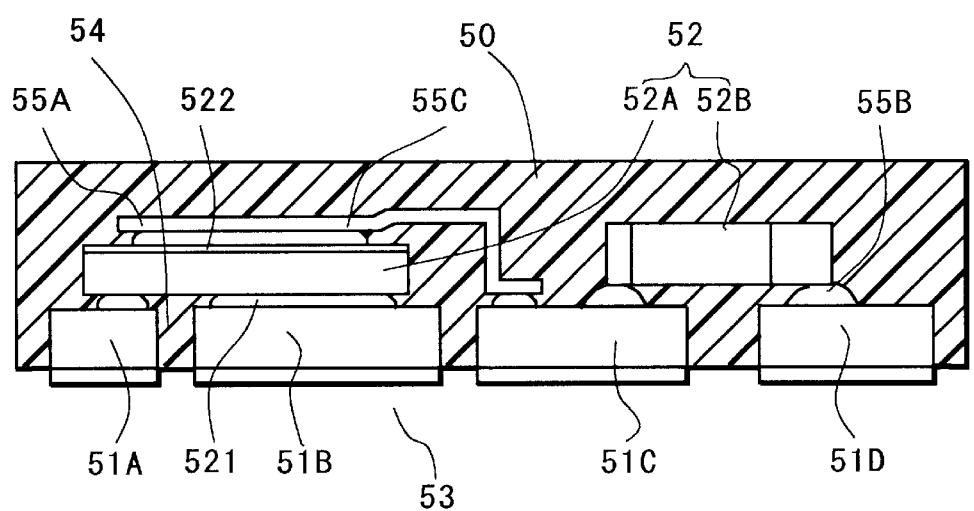
FIG. 1 is a cross-sectional view for explaining a circuit device of the present invention.

FIG. 1 shows a circuit device 53 having the conductive paths 51 buried into an insulating resin 50, a circuit element 52 fixed on the conductive paths 51, and an insulating resin 50 for integrally supporting the conductive paths 51.

This structure is comprised of the circuit elements 52A, 52B, a plurality of conductive paths 51A, 51B, 51C, 51D, and the insulating resin 50 for burying the conductive paths 51A, 51B, 51C, 51D, the insulating resin 50 being filled in a trench 54 between the conductive paths 51. And the conductive paths 51 are supported by the insulating resin 50.

This insulating resin 50 maybe a thermosetting resin such as epoxy resin, or a thermoplastic resin such as polyimide resin and polyphenylene sulfide. Also, all kinds of insulating resin may be used as far as they can be fixed using a mold, or coated by dipping or application.

The conductive path 51 may be a conductive foil made of Cu as a main material, a conductive foil made of Al as a main material, or a conductive foil made of an alloy such as Fe—Ni. Of course, other conductive materials may be used. Particularly, the conductive materials that can be etched and conductive materials that can evaporate by laser are preferable.

Further, a circuit element 52 may be composed of, but not limited to, a semiconductor chip 52A having a front electrode 521 and a back electrode 522, and a chip component 52B such as a chip resistor and a chip condenser. The semiconductor bare chip 52A will be described later in detail, and is omitted here.

Further, the connecting means of the circuit element 52 may be a metallic connecting plate 55A, a conductive ball made of the brazing material, a flattening conductive ball, a brazing material 55B such as solder, a conductive paste 55C such as Ag paste, a conductive film or an anisotropic conductive resin. These connecting means may be selected depending on the kind of circuit element 52, and the packaging form of circuit element 52. For example, for a bare semiconductor chip, the connection between the front electrode 521 and the conductive path 51 is made by the brazing material 55B such as solder, or the conductive paste 55C such as Ag paste, and the connection between the back electrode 522 and the conductive path 51 is made by the metallic connecting plate 55A using the brazing material 55B such as solder. The front electrode 521 may be a projection electrode formed of a gold bump. Further, the chip resistor or chip condenser may be the solder 55B.

In this circuit device, because the conductive path 51 is supported by the insulating resin 50 that is a sealing resin, there is no need of having a support board for supporting the conductive paths. Therefore, the circuit device is constituted of the conductive path 51, the circuit element 52, and the insulating resin 50. This constitution is a feature of the present invention. As described in the section of prior art, the conductive path of the conventional circuit device is supported by the support board, or supported by a lead frame, whereby an additional structure that is unnecessary in essence is added. However, this circuit device is constituted of a minimum amount of constituent elements, without need of the support board, whereby there is a feature of thin type and low cost.

Further in the case of forming a fine circuit pattern, very high pattern accuracy and reliability can be obtained. And since the pattern of the conductive path is made of Cu foil. Very low resistance can be obtained.

Figure 30:
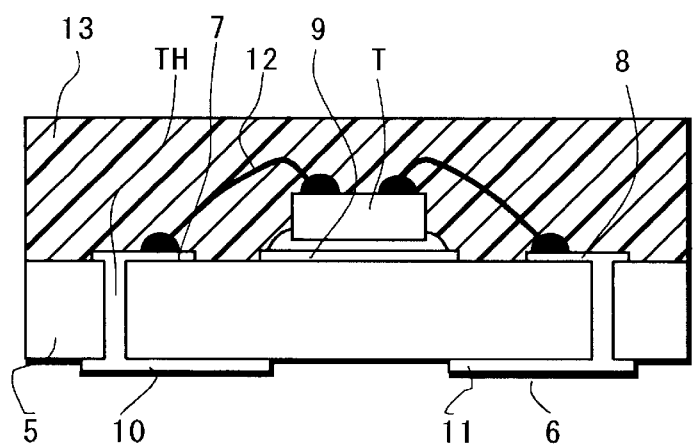
FIG. 30 is a cross-sectional view for explaining the conventional circuit device.

As clearly shown in FIG. 1 in comparison with FIG. 30, the thickness Tc of the conductive path for the total thickness Tp of the semiconductor device package is very high in comparison with the conventional device. In the present invention, the thickness Tc of the conductive path is 60–70 μm, and the total thickness Tp of the semiconductor device package is 650 μm. Contrary that, in the conventional device, the thickness Tc of the conductive path for the total thickness Tp of the semiconductor device package is small.

Besides the above constitution, the insulating resin 50 for coating the circuit element 52 and supporting integrally the conductive paths by being filled in the trench 54 between the conductive paths 51 is provided.

Between the conductive paths 51, there is provided the trench 54, which is filled with the insulating resin 50, bringing about a merit of providing the insulation between the conductive paths 51.

The insulating resin 50 supports integrally the circuit element and the conductive paths by covering the circuit element 52 and being filled in the trench 54 between the conductive paths 51, with a back face of the conductive paths 51 exposed.

One of the features of the invention is that the back face of this conductive path is exposed. The back face of the conductive path can be subjected to connection with the outside, in which there is a feature that no through hole for use with the conventional structure is required as shown in FIG. 30.

Also, this circuit device 53 has such a structure that the surface of the trench 54 is substantially flush with the surface of the conductive path 51. This structure is a feature of the invention, and since there is no difference in level between the back electrodes 10, 11 as shown in FIG. 30, such a feature is provided that the circuit device 53 can be readily moved horizontally at mounting the circuit device 53 on a printed circuit board and so on.

Further, in this circuit device, the semiconductor bare chip 52A is fixed on the conductive paths 51A, 51B in a flip chip method with the front electrode 521 faced down. Therefore, the loop of bonding wire as conventionally required can be dispensed with, resulting in a merit that the thin type structure can be realized.

Second Embodiment of Circuit Device

Figure 9:
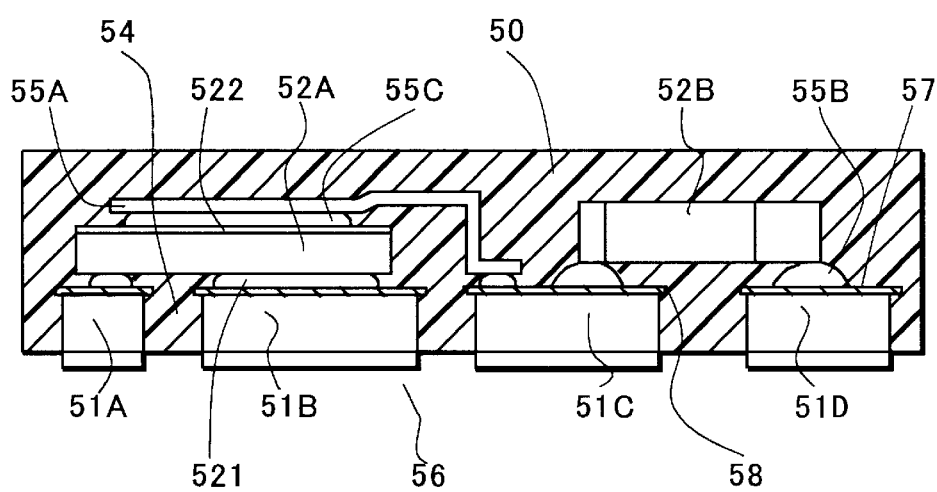
FIG. 9 is a cross-sectional view for explaining a circuit device of the invention.
Figure 10:
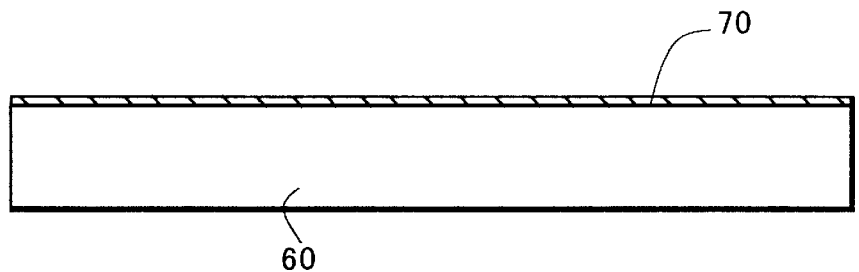
FIG. 10 is a cross-sectional view for explaining a manufacturing method of the circuit device of the invention.
Figure 11:
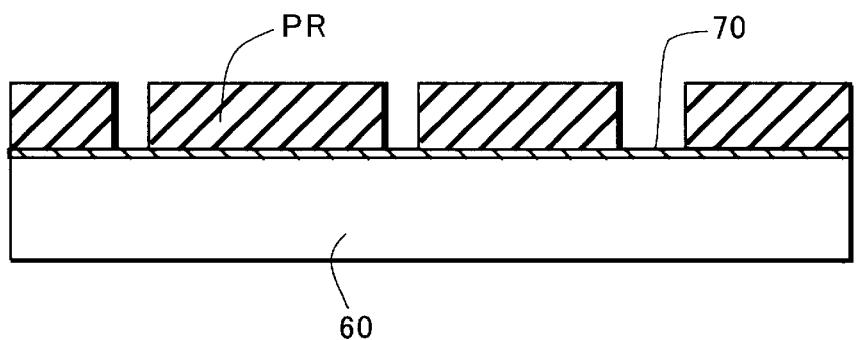
FIG. 11 is a cross-sectional view for explaining the manufacturing method of the circuit device of the invention.
Figure 12:
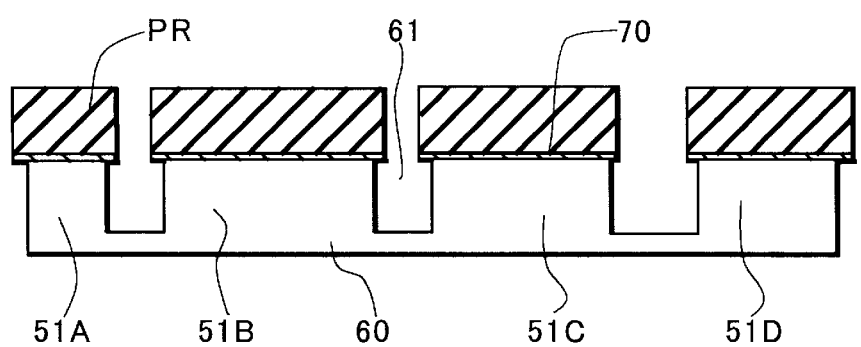
FIG. 12 is a cross-sectional view for explaining the manufacturing method of the circuit device of the invention.
Figure 13:
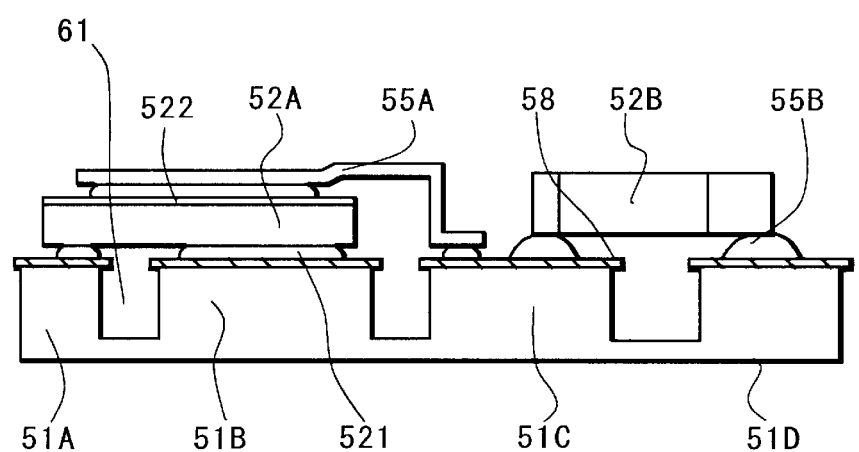
FIG. 13 is a cross-sectional view for explaining the manufacturing method of the circuit device of the invention.
Figure 14:
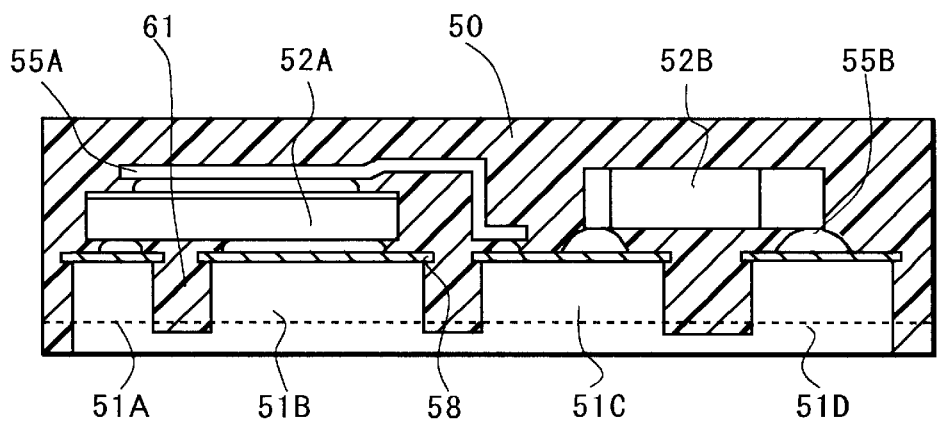
FIG. 14 is a cross-sectional view for explaining the manufacturing method of the circuit device of the invention.

Referring now to FIG. 9, a circuit device 56 will be described below.

This structure is substantially the same as that of FIG. 1, except that a conductive film 57 is formed on the surface of the conductive paths 51. Therefore, this conductive film 57 will be only described below.

A first feature is that the conductive film 57 is provided to prevent curvature of the conductive paths as well as warp of the circuit device.

Generally, owing to a difference in thermal expansion coefficient between the insulating resin and the material of the conductive paths (hereinafter referred to as a first material), the circuit device itself may be warped, or the conductive paths may be curved or exfoliated. Since the thermal conductivity of the conductive paths 51 is higher than that of the insulating resin, the conductive paths 51 are more likely to rise in temperature and expanded. Therefore, a second material having a smaller thermal expansion coefficient than the first material is covered to prevent curvature or exfoliation of the conductive paths, and warp of the circuit device. Particularly in the case where Cu is employed as the first material, the second material is preferably Au, Ni or Pt. The expansion coefficient of Cu is 16.7×10−6 (minus sixth power of 10); the expansion coefficient of Au is 14×10−6; the expansion coefficient of Ni is 12.8×10−6; and the expansion coefficient of Pt is 8.9×10−6.

A second feature is that an anchor effect is provided by the second material. A visor 58 is formed by the second material, and the visor 58 adhered with the conductive path 51 is buried into the insulating resin 50, so that the anchor effect is produced, thereby preventing slippage of the conductive paths 51.

First Embodiment of Manufacturing Method of Circuit Device

A manufacturing method of the circuit device 53 will be described below with reference to FIGS. 1 to 8.

Figure 2:
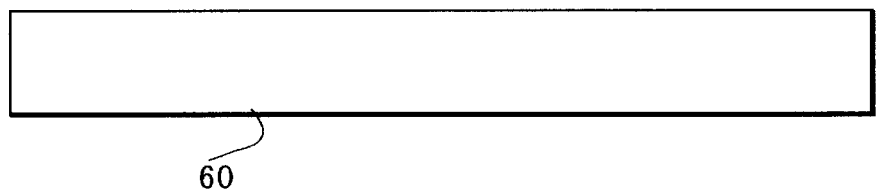
FIG. 2 is a cross-sectional view for explaining a manufacturing method of the circuit device of the invention.

First of all, a sheet conductive foil 60 is prepared as shown in FIG. 2. The material for this conductive foil 60 is chosen in consideration of the adhesion, bonding strength and plating property of the brazing material. This conductive foil 60 may be a conductive foil made of Cu as a principal material, a conductive foil made of Al as a principal material, or a conductive foil made of Fe—Ni alloy.

The thickness of the conductive foil is preferably about 10 to 300 $\mu$m in consideration of etching. Here, a copper foil having a thickness of 70 $\mu$m (2 ounces) was adopted. However, the conductive foil may be fundamentally over 300 $\mu$m or below 10 $\mu$m in thickness. As will be described later, it is necessary that a trench 61 shallower than the thickness of the conductive foil 60 may be formed.

The sheet conductive foil 60 rolled in a predetermined width may be prepared and carried in the ensuing steps, or the conductive foils cut in a predetermined size may be prepared and carried in the ensuing steps.

Subsequently, there is a step of removing the conductive foil 60 to be thinner than the thickness of the conductive foil 60, except for at least the region that becomes the conductive path 51. And then an insulating resin 50 covers the isolation trench 61 formed by the step of removing and the conductive coil 60.

Figure 3:
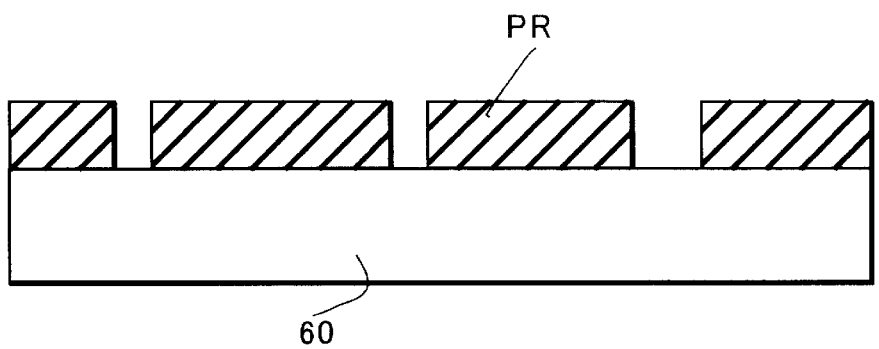
FIG. 3 is a cross-sectional view for explaining the manufacturing method of the circuit device of the invention.
Figure 4:
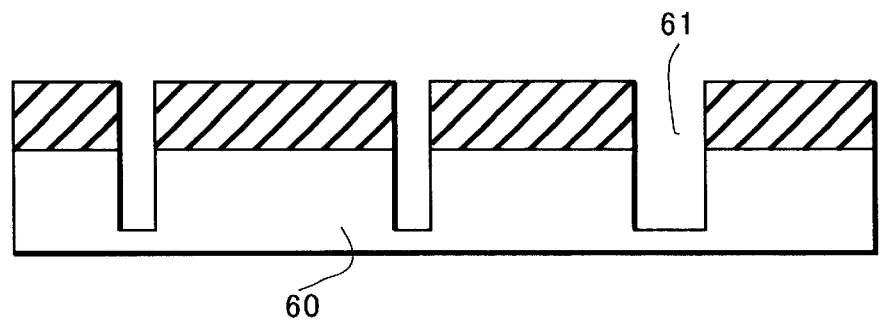
FIG. 4 is a cross-sectional view for explaining the manufacturing method of the circuit device of the invention.

Firstly, a photo-resist (anti-etching mask) PR is formed on the Cu foil 60, and patterned to make the conductive foil 60 exposed except for the region that becomes the conductive path 51 (see FIG. 3). Then the etching may be made via the photo-resist PR (see FIG. 4).

A trench 61 is formed by etching, for example, in a depth of 50 $\mu$m, and its side face is rough, so that the adhesive property with the insulating resin 50 is enhanced.

A side wall of the trench 61 is typically illustrated straightly, but has a different structure depending on the removing method. This removing step may be performed by wet etching, dry etching, laser evaporation, or dicing. In the case of wet etching, the etchant may be ferric chloride or cupric chloride principally. The conductive foil is dipped in this etchant, or showered by this etchant. Herein, the wet etching is typically isotropic etching, and the side face of the trench 61 has a curved structure.

In the case of the dry etching, the anisotropic or isotropic etching can be made. At present, it is said that Cu can not be removed by reactive ion etching, but can be removed by sputtering. The anisotropic or isotropic etching may be employed depending on the sputtering conditions.

In the laser, the trench can be formed by directly applying a laser beam. In this case, the side face of the trench 61 becomes rather straight.

In the dicing, a tortuous complex pattern can not be formed, but a grid-like trench can be formed.

In FIG. 3, a conductive film that is corrosion resistant to the etching solution may be selectively covered, instead of the photo-resist. If the conductive film is selectively covered on a portion that becomes the conductive path, this conductive film becomes an etching protective film, and the trench can be etched without the use of the resist. The materials for this conductive film may include Ag, Au, Pt and Pd. And the corrosion-resisting conductive film has a feature that it can be directly used as the die pad or bonding pad.

Figure 5:
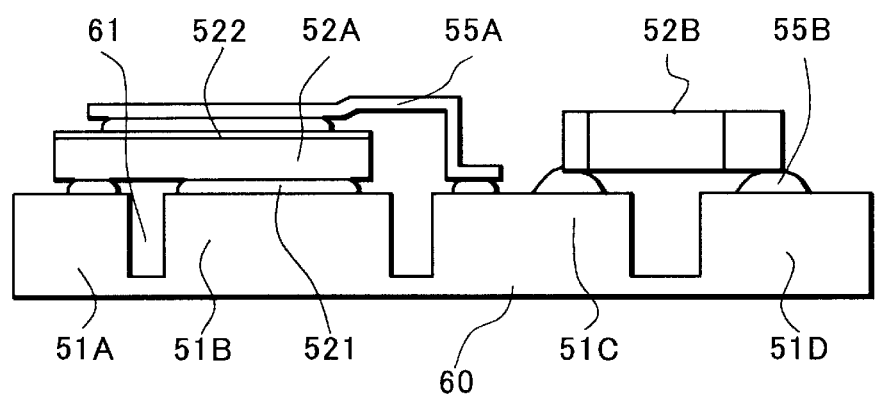
FIG. 5 is a cross-sectional view for explaining the manufacturing method of the circuit device of the invention.

After that, there is a step of mounting and electrically connecting the circuit element 52 to the conductive foil 60 having the trench 61 formed, as shown in FIG. 5.

The circuit element 52 may be the semiconductor element such as a transistor, a diode, or an IC chip, or the passive element such as a chip condenser or a chip resistor.

Herein, the front electrode 521 of the bare transistor chip 52A that becomes a base electrode is fixed on the conductive path 51A, and the front electrode 521 that becomes an emitter electrode is fixed on the conductive path 51B, in the flip chip method, using the brazing material such as solder or the conductive paste 55B. Also, the back electrode 522 that becomes a collector electrode of the transistor chip 52A has one end of the metallic connecting plate 55A made of copper and bent like an L character connected by the brazing material such as solder or the conductive paste 55B, the other end being connected to the conductive path 51C in the same manner. This metallic connecting plate 55A can be easily mounted in rough alignment, using a deformed component mounter, because the back side of the transistor chip 52A is only the back electrode 522. Further, reference numeral 52B denotes a passive element such as a chip resistor, which is fixed by the brazing material such as solder or the conductive paste 55B.

Figure 6:
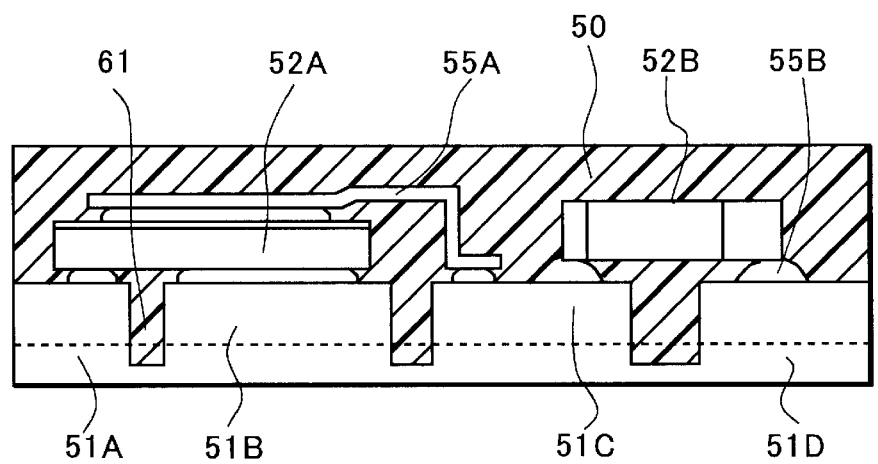
FIG. 6 is a cross-sectional view for explaining the manufacturing method of the circuit device of the invention.

Further, there is a step of attaching the insulating resin 50 to the conductive foil 60 and the trench 61, as shown in FIG. 6. This step is effected by transfer molding, injection molding, or dipping. The resin materials include the thermosetting resin such as epoxy resin which is subjected to transfer molding, and the thermoplastic resin such as polyimide resin or polyphenylene sulfide which is subjected to injection molding.

In this embodiment, the thickness of the insulating resin coated on the surface of the conductive foil 60 is adjusted to be about 100 μm from the top portion of the circuit element. This thickness may be increased or decreased in consideration of the strength.

Figure 31A:
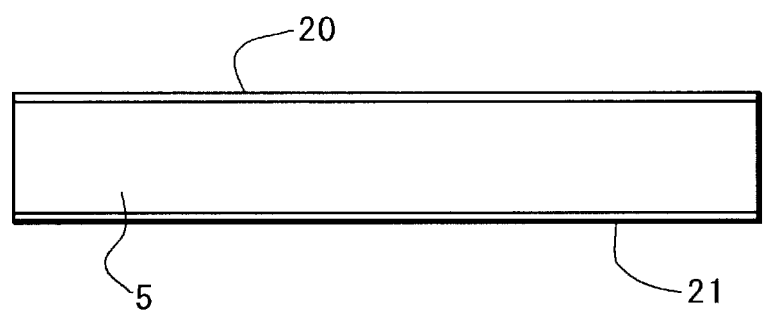
FIGS. 31A, B, C, D is a cross-sectional view for explaining a manufacturing method of the conventional circuit device.
Figure 31B:
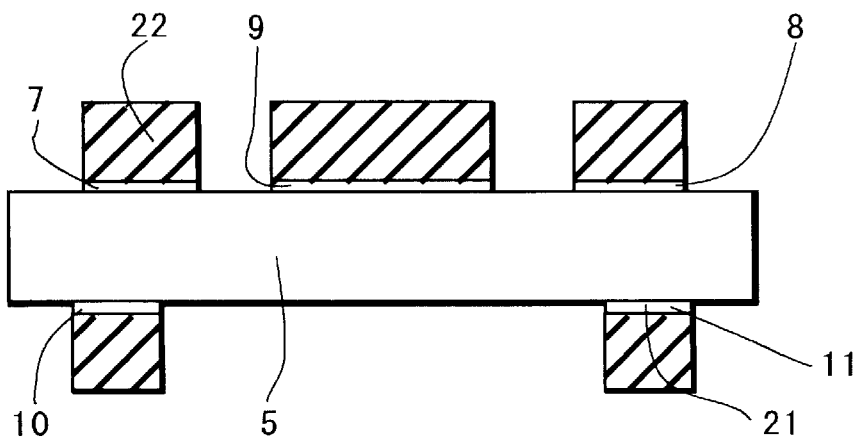
Figure 31C:
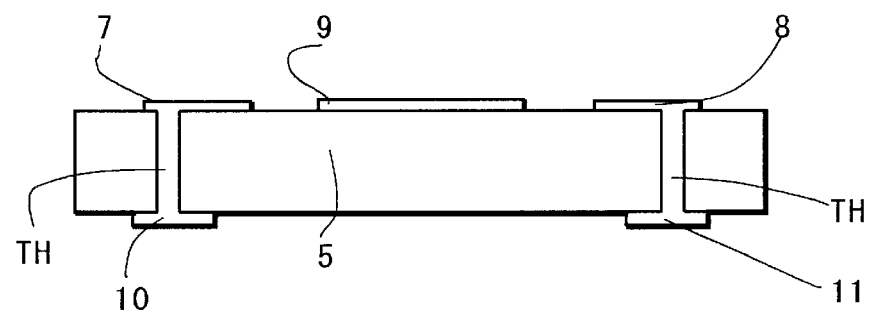
Figure 31D:
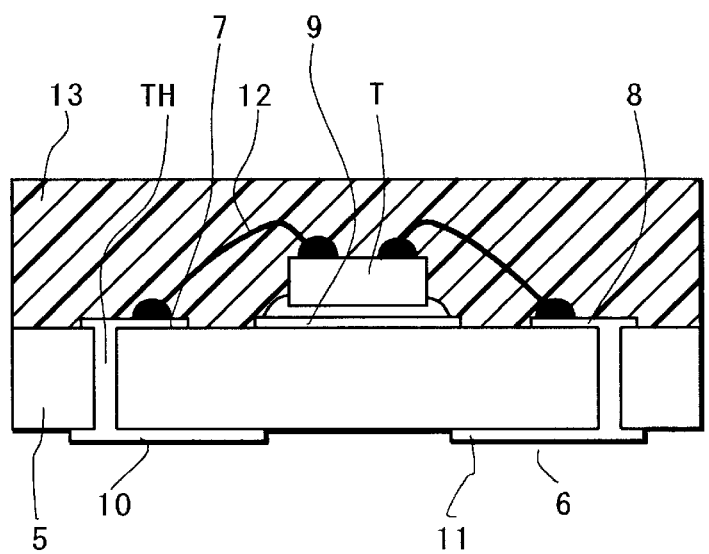

A feature of this step is that the conductive foil 60 which becomes the conductive path 51 serves as a support substrate till the insulating resin 50 is covered. Conventionally, the support substrate 5 which is unnecessary in essence is employed to form the conductive paths 7 to 11, as shown in FIG. 31(D). However, in the present invention, the conductive foil 60 that becomes the support substrate is a required member as the electrode material. Therefore, there is the merit that the work can be done by omitting the constituent material as much as possible, and the costs can be reduced.

Since the trench 61 is shallower than the conductive foil, the conductive foil 60 is not separated individually as the conductive paths 51. Accordingly, the invention has a feature that the sheet conductive foil 60 can be handled as one piece, and particularly in molding the insulating resin, the work of carrying the conductive foil 60 to the mold, and attaching it on the mold is facilitated.

Subsequently, there is a step of removing the back face of the conductive foil 60 chemically and/or physically to separate the conductive paths 51. This removing step is performed by polishing, grinding, etching or metal evaporation of laser.

In the experiments, the overall surface is ground about 30 μm thick by the polishing apparatus or grinding apparatus, with the insulating resin 50 exposed from the trench 61. This exposed face is indicated by the dotted line in FIG. 6. As a result, the conductive paths 51 having a thickness of about 40 μm are separated. Also, the overall surface of the conductive foil 60 may be wet etched, and then polished or ground by the polishing or grinding apparatus to expose the insulating resin 50. Further, the overall surface of the conductive foil 60 may be wet etched till the insulating resin 50 is exposed, thereby exposing the insulating resin 50.

Consequently, the surface of the conductive paths 51 is exposed from the insulating resin 50. And the trench 61 is ground to produce the trench 54 as shown in FIG. 1 (see FIG. 6).

Lastly, a conductive material such as solder is covered on the exposed conductive paths 51, as required, to complete a circuit device.

In the case where a conductive film is applied on the back face of the conductive paths 51, the conductive film may be formed in advance on the back face of the conductive foil of FIG. 2. In this case, the conductive film may be selectively applied on a portion corresponding to the conductive path. The applying method may be made by plating, for example. This conductive film should be made of a material that is resistant to etching. In the case where the conductive film is employed, the conductive paths 51 can be separated only by etching, without polishing.

With this manufacturing method, a transistor and a chip resistor are only mounted on the conductive foil 60, but may be arranged in a matrix form as a unit, or either one of the circuit elements may be arranged in a matrix form as a unit. In this case, the matrix can be divided individually by using a dicing apparatus, as will be described later.

With the above manufacturing method, the conductive paths 51 are buried into the insulating resin 50, and the circuit device 56 can be produced in which the back face of the insulating resin 50 is substantially flush with the back face of the conductive paths 51.

This manufacturing method has a feature that the insulating resin 50 is utilized as the support substrate 5, allowing the separation work of the conductive paths 51. The insulating resin 50 is a material required for burying the conductive paths 51, and can dispense with the support substrate as required in the conventional manufacturing method of FIG. 31. Accordingly, the circuit device can be manufactured with a minimum amount of material at the reduced costs.

The thickness of the insulating resin from the surface of the conductive paths 51 can be adjusted at the previous step of attaching the insulating resin. In the present invention, the semiconductor bare chip 52A is fixed on the conductive paths 51 in the flip chip method, and the bonding wire can be eliminated. Accordingly, the thickness of the circuit device 56 can be made very thin, depending on the thickness of the semiconductor bare chip 52A to be mounted. Herein, the circuit device is produced in which the conductive paths 51 having a thickness of 40 μm and the circuit element are buried into the insulating resin 50 having a thickness of 400 μm (see FIG. 1).

Figure 7:
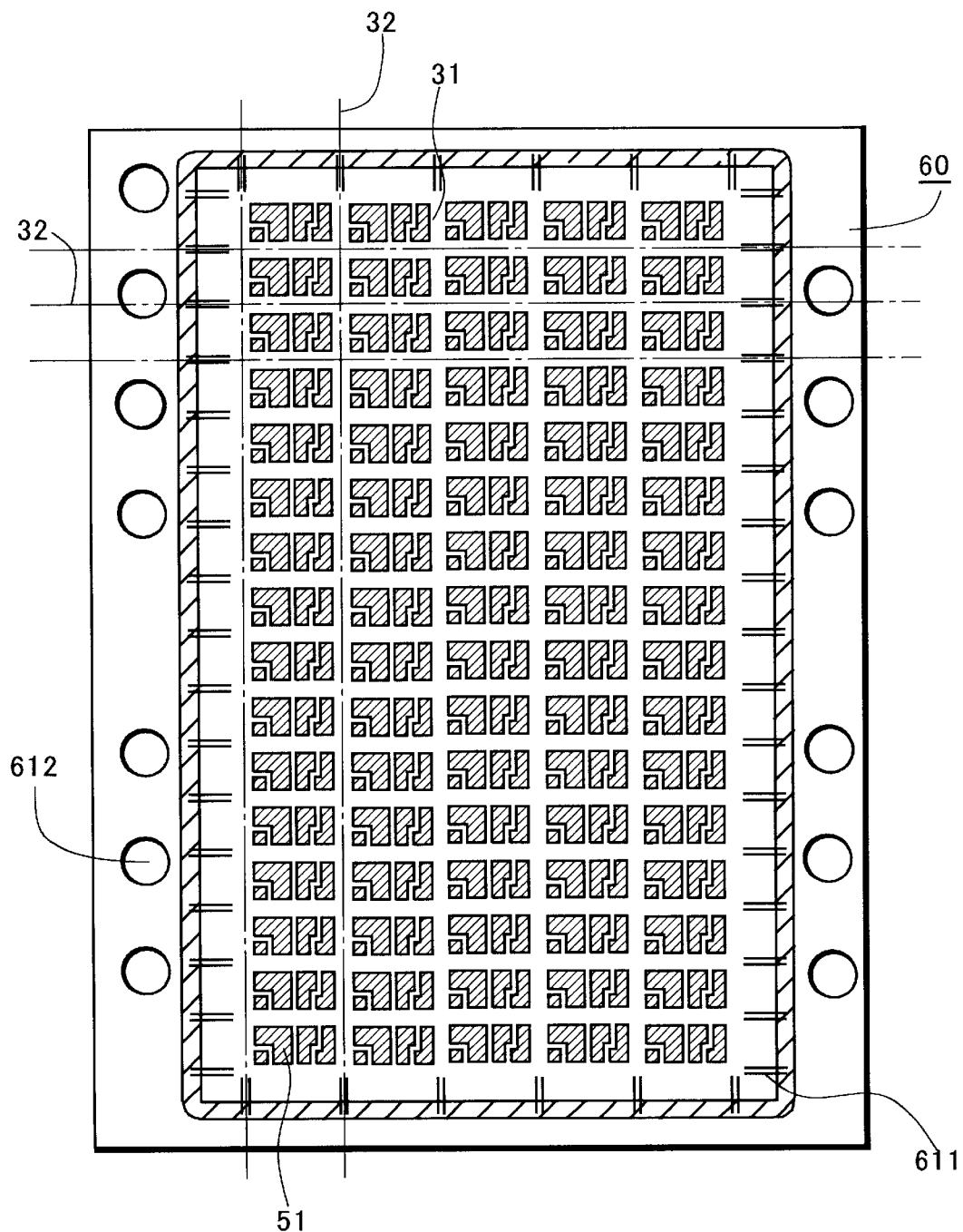
FIG. 7 is a cross-sectional view for explaining the manufacturing method of the circuit device of the invention.

FIG. 7 is a plan view of a substrate of the conductive foil 60 after the trench 61 is formed. This substrate is as large as 45 mm×60 mm. The conductive paths 51 are indicated by the black part, and the trenches 61 are indicated by the white part. Accordingly, the circuit devices 53, 56 are arranged like a matrix of 5 rows and 17 lines, an alignment mark 611 and an index pore 612 for use during the manufacture being provided on the marginal portion.

Figure 8:
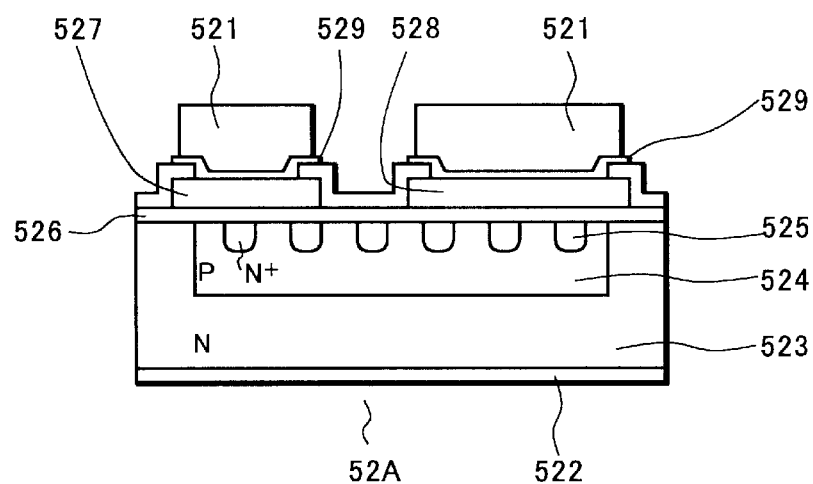
FIG. 8 is a cross-sectional view for explaining the manufacturing method of the circuit device of the invention.

FIG. 8 is a cross-sectional view of a specific structure of the semiconductor bare chip 52A. The semiconductor chip 52A has a P-type base region 524 and an N-type emitter region on an N-type semiconductor substrate 523. On an insulating film 526 of the semiconductor substrate 523, an underlying base electrode 527 and an underlying emitter electrode 528 which are in contact with the P-type base region 524 and the N-type emitter region 525 respectively and formed by sputtering aluminum are provided. On this underlying base electrode 527 and the underlying emitter electrode 528, a barrier metal layer 529 of Pd/Ti or Au/TiW is provided. And a base front electrode 521 and an emitter front electrode 521 formed of a gold plated layer are provided about 25 μm thick thereon. Also, a back electrode 522 is provided by deposition of Au/Cr over the back face of the semiconductor substrate 523.

Second Embodiment of Manufacturing Method of Circuit Device

Referring now to FIGS. 9 to 14, a manufacturing method of a circuit device 56 having a visor 58 will be described below. The second embodiment is substantially the same as the first embodiment, except that a second material 70 for forming the visor is attached, and is not described in detail.

First of all, a conductive foil 60 composed of a first material having a second material 70 of small etching rate applied thereon is prepared.

For example, if Ni is applied on the Cu foil, Cu and Ni are etched at the same time by ferric chloride and cupric chloride, and conveniently, owing to a difference between etching rates, Ni is formed to be a visor 58. The bold solid line indicates a conductive film 70 made of Ni, its film thickness being preferably about 1 to 10 μm. As the Ni film thickness is larger, the visor 58 is more likely to form.

As the second material, a material which can be selectively etched against the first material, can be used. In this case, a film made of the second material is patterned to cover the formation region of the conductive paths 51, and using the patterned film as a mask, a film made of the first material is etched, so that the visor 58 can be formed. The second materials may include Al, Ag, and Au (see FIG. 10).

Subsequently, there is a step of removing the conductive foil 60 excluding at least the region that becomes the conductive paths 51 to be less than the thickness of the conductive foil 60.

A photo-resist PR is formed on the Ni conductive film 70, and patterned to expose the Ni conductive film excluding the region that becomes the conductive paths 51. Then the etching is made via the photo-resist.

If the etching is made using the etchant of ferric chloride or cupric chloride, as previously described, the visor 58 is protruded as the etching progresses, because the etching rate of Ni conductive film 70 is smaller than that of the conductive film Cu 60.

A step of mounting a circuit device 52 on the conductive foil 60 formed with the trench 61 (FIG. 13), a step of covering the conductive foil 60 and the trench 61 with the insulating resin 50 and removing the back face of the conductive foil 60 chemically and/or physically to separate the conductive foils (paths) 51 (FIG. 14), and a step of forming the conductive film on the back face of the conductive paths to complete the circuit devices (FIG. 9) are the same as those of the previous manufacturing method, and are not described here.

As described above, with the present invention, the circuit device is constituted of a minimum amount of the circuit element, the conductive path and insulating resin, without wasting resources. Hence, the circuit device can be realized without expense of extra constituent elements up to completion, and with the reduced costs.

Since a semiconductor bare chip is fixed on the conductive path in a flip chip method, the bonding wire can be unnecessary, the film thickness of the insulating resin and the thickness of the conductive foil are optimized. The circuit device can be very thin with a height of 0.5 mm or less, and reduced in size and weight.

Since the back face of the conductive paths is only exposed from the insulating resin, there is the advantage that the back face of the conductive paths can be directly connected to the outside, so that the back electrode of the conventional structure and the through hole can be dispensed with, as shown in FIG. 30.

Also, this circuit device has such a structure that the surface of the trench is substantially flush with the surface of the conductive paths. When mounting QFP at a narrow pitch, since the circuit device itself can be moved horizontally owing to a surface tension of the solder, the correction for electrode dislocation can be effected easily.

Since the second material is formed on the surface of the conductive paths, it is possible to prevent warp of the mounting board, particularly curvature or exfoliation of the slender interconnect, which may be caused owing to a difference between thermal expansion coefficients.

By forming a film of the second material on the surface of the conductive paths, a visor adherent with the conductive path can be formed. Hence, it is possible to develop an anchor effect, and prevent the warp or slippage of the conductive paths.

With a manufacturing method of circuit device of the present invention, the conductive foil itself to make the conductive paths is employed as a support substrate, acting to support the whole circuit up to the steps of forming the trench, mounting the circuit element, and covering the insulating resin, and at a step of dividing the conductive foil into individual conductive paths, the insulating resin is employed as the support substrate. Accordingly, the circuit device can be fabricated of a minimum amount of the circuit element, the conductive foil, and insulating resin. As described above in the prior art, the support substrate can be dispensed with to produce the circuit device, and the costs can be reduced. Since the support substrate is unnecessary, the conductive paths are buried into the insulating resin, the thickness of insulating resin and the thickness of conductive paths can be adjusted, and the bonding wire is not required, there is a merit that a very thin circuit device can be produced.

Figure 32:
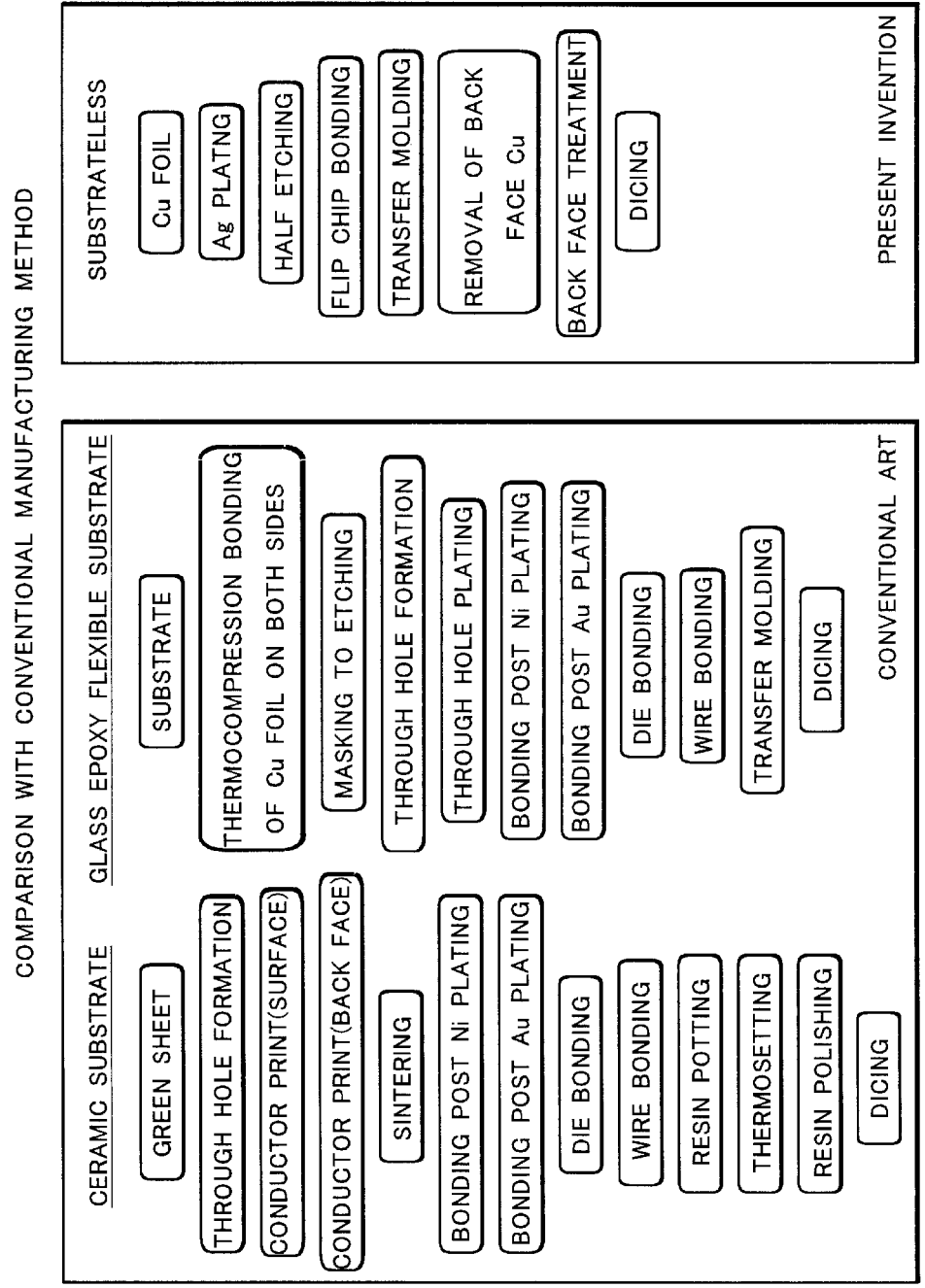
FIG. 32 is a chart for explaining a conventional manufacturing method of the circuit device and a manufacturing method of the circuit device according to the invention.
Figure 34:
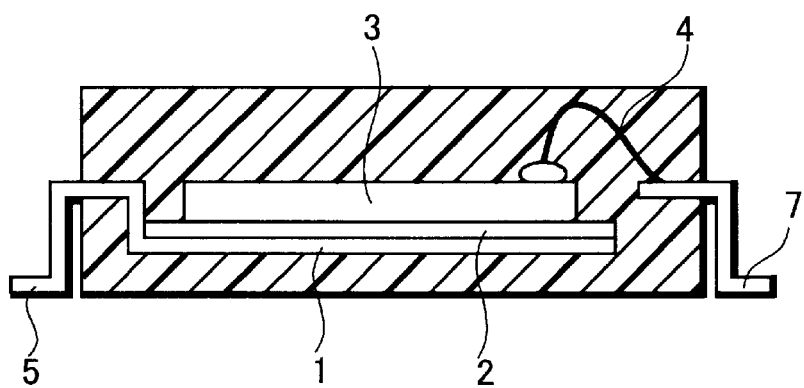
FIG. 34 is a cross-sectional view for explaining the conventional MOSFET mounting structure.
Figure 35:
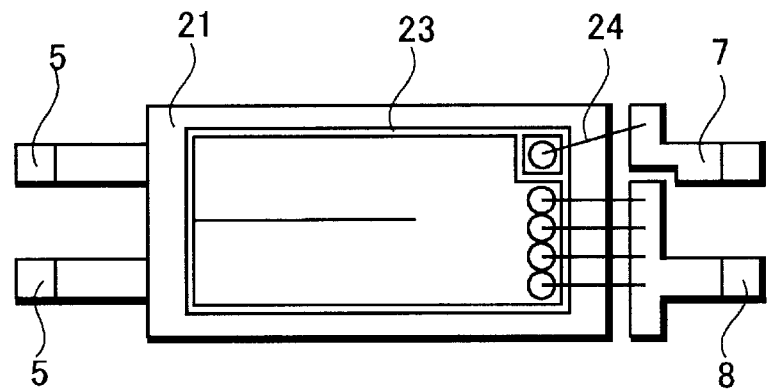
FIG. 35 is a plan view for explaining the conventional MOSFET mounting structure.
Figure 36:
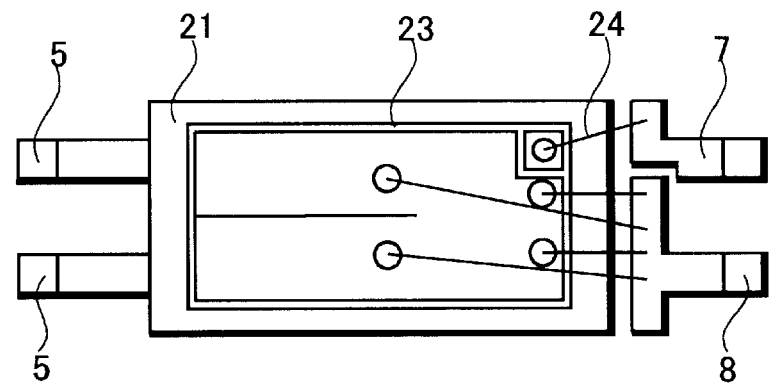
FIG. 36 is a plan view for explaining the conventional MOSFET mounting structure.

As will be clear from FIG. 32, the step of forming the through hole and the step of printing the conductor (in the case of a ceramic substrate) can be omitted, whereby there is the advantage that the manufacturing process can be greatly shortened, and the whole process can be effected internally. The frame molding is not required at all, so that the manufacturing method is capable of effecting the very short delivery.

Since the conductive paths can be handled without separating them up to the step of removing the conductive foil to be less than its thickness (e.g., half-etching), many circuit devices can be integrated on a small substrate, resulting in a feature of the enhanced workability. Further supporting characteristic is very reliable and bonding characteristic is excellent.

Since the conductive paths form a plane flush with the insulating resin, the mounted circuit device can be shifted without abutting against the side face of the conductive paths on the mounting board. In particular, the mounted circuit device that has been dislocated can be shifted horizontally and rearranged. If the brazing material is molten after mounting the circuit device, the mounted circuit device dislocated tends to get back to the upper portion of the conductive paths, owing to a surface tension of the molten brazing material, so that the circuit device itself can be rearranged.

Third Embodiment of MOSFET Mounting Structure

Figure 15:
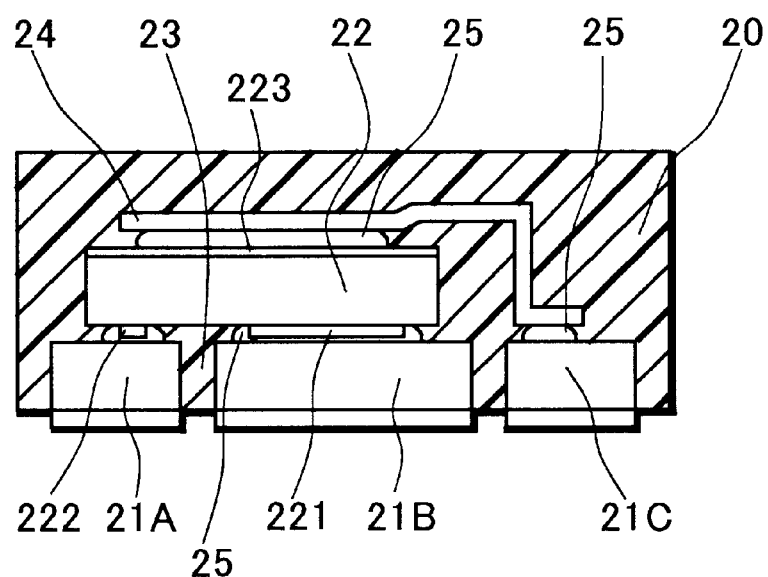
FIG. 15 is a cross-sectional view for explaining a MOSFET mounting structure of the present invention.

Referring now to FIG. 15, a MOSFET mounting structure of the present invention will be described below.

FIG. 15 shows a MOSFET mounting structure having the conductive paths 21 buried into an insulating resin 20, in which a MOSFET chip 22 is fixed on the conductive paths 21, and the insulating resin 20 supports the conductive paths 21.

This structure is comprised of the MOSFET chip 22, a plurality of conductive paths 21A, 21B, 21C, a metal connecting plate 24, and the insulating resin 20 for burying the conductive paths 21A, 21B, 21C, the insulating resin 20 being filled in a trench 23 between the conductive paths 21. And the conductive paths 21 are supported by the insulating resin 20.

This insulating resin 20 maybe a thermosetting resin such as epoxy resin, or a thermoplastic resin such as polyimide resin, and polyphenylene sulfide. Also, all kinds of insulating resin may be used as far as they can be fixed using a mold, or coated by dipping or application. The conductive path 21 may be a conductive foil made of Cu as a main material, a conductive foil made of Al as a main material, or a conductive foil made of an alloy such as Fe—Ni. Of course, other conductive materials may be used. Particularly, the conductive materials that can be etched, and conductive materials that can evaporate by laser are preferable.

Further, a MOSFET chip 22 may be composed of a semiconductor bare chip having a source electrode 221 and a gate electrode 222 on the surface, and a drain electrode 223 on the back face. The detailed structure of the MOSFET chip 22 will be described later in detail with reference to FIG. 22, and is omitted here.

Further, the connection of the MOSFET chip 22 may be made in such a way that the source electrode 221 and the gate electrode 222 on the surface are fixed to the conductive paths 21A, 21B by using a conductive ball made of the brazing material, a flattening conductive ball, a brazing material such as solder, a conductive paste 25 such as Ag paste, and the drain electrode 223 on the back face is connected to the metallic connecting plate 24 by using the brazing material such as solder or a conductive paste such as Ag paste, one end of the metallic connecting paste substantially covering the drain electrode 223 and the other end being fixed to the conductive path 21C.

In this mounting structure, because the conductive paths 21 are supported by the insulating resin 20 that is a sealing resin, there is no need of having a support board for supporting the conductive paths. Therefore, the MOSFET mounting structure is constituted of the conductive paths 21, the MOSFET chip 22, the metallic connecting plate 24 and the insulating resin 20, with a minimum amount of components, whereby there is a feature of thin type and low cost.

In this mounting structure, the insulating resin 20 has the function of covering the MOSFET chip 22 and supporting integrally the conductive paths by being filled in the trench 24 between the conductive paths 21, thereby bringing about the merit that the conductive paths 21 can be isolated from each other by the insulating resin 20.

A main feature of this mounting structure is that the conventional bonding wire is not employed, and the source electrode can be directly bonded to the conductive path 21B in the flip chip method. Therefore, as will be apparent from FIG. 33, in the mounting structure of the invention, the on resistance of sample C (bonded by solder) is 8.67 mΩ, and the on resistance of sample D (bonded by silver paste) is 8.74 mΩ. In either case, the on resistance was improved about 30% as compared with the on resistance of sample B of 12.10 mΩ by the conventional wire bonding. Simultaneously, the loop required for the bonding wire can be eliminated, so that the insulating resin 20 can be made thinner, leading to the thin type MOSFET mounting structure.

In this mounting structure, the surface of the insulating resin 20 being filled in the trench 24 is substantially flush with the surface of the conductive paths 21. When this packaged mounting structure is mounted on a printed circuit board, the mounting structure will float owing to a surface tension of the brazing material such as solder, and will be able to be shift horizontally, whereby there is a feature that the self-alignment can be automatically effected.

Forth Embodiment of MOSFET Mounting Structure

Figure 23:
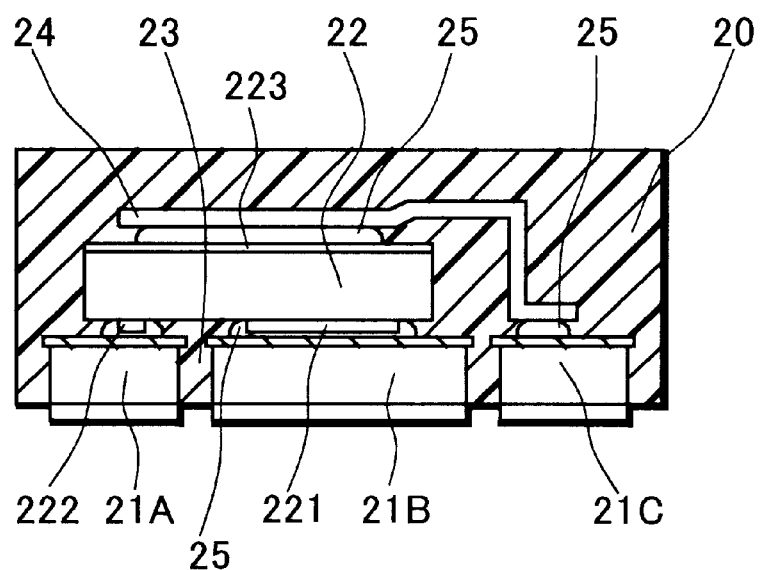
FIG. 23 is a cross-sectional view for explaining a MOSFET mounting structure of the invention.
Figure 24:
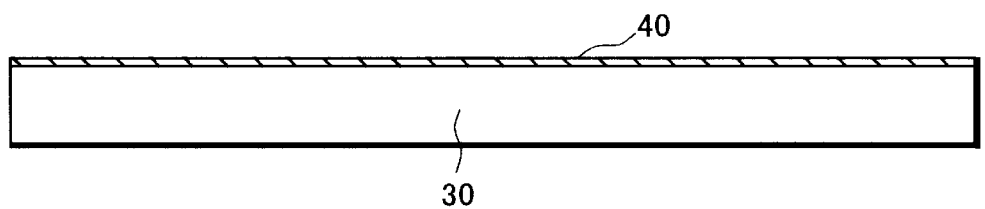
FIG. 24 is a cross-sectional view for explaining a manufacturing method of the MOSFET mounting structure of the invention.
Figure 25:
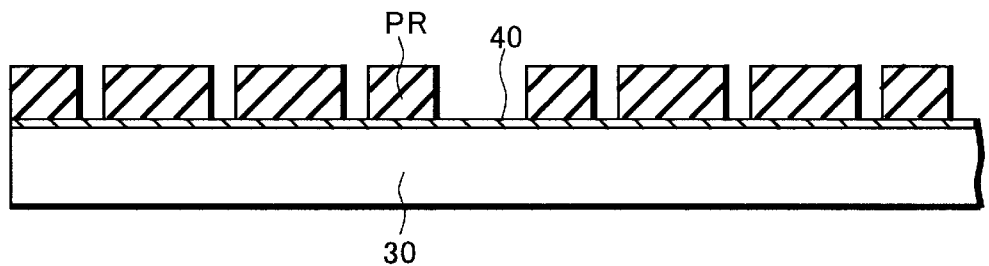
FIG. 25 is a cross-sectional view for explaining the manufacturing method of the MOSFET mounting structure of the invention.
Figure 26:
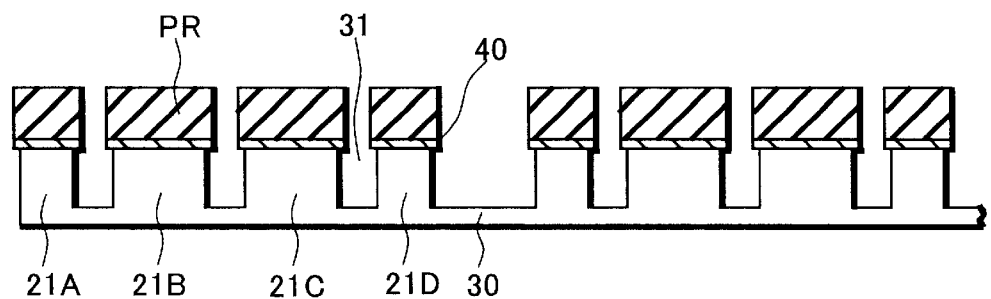
FIG. 26 is a cross-sectional view for explaining the manufacturing method of the MOSFET mounting structure of the invention.
Figure 27:
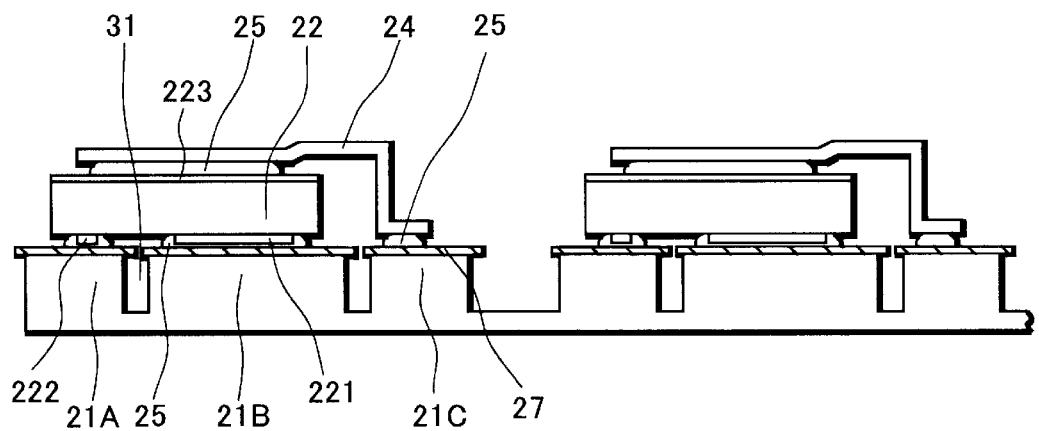
FIG. 27 is a cross-sectional view for explaining the manufacturing method of the MOSFET mounting structure of the invention.
Figure 28:
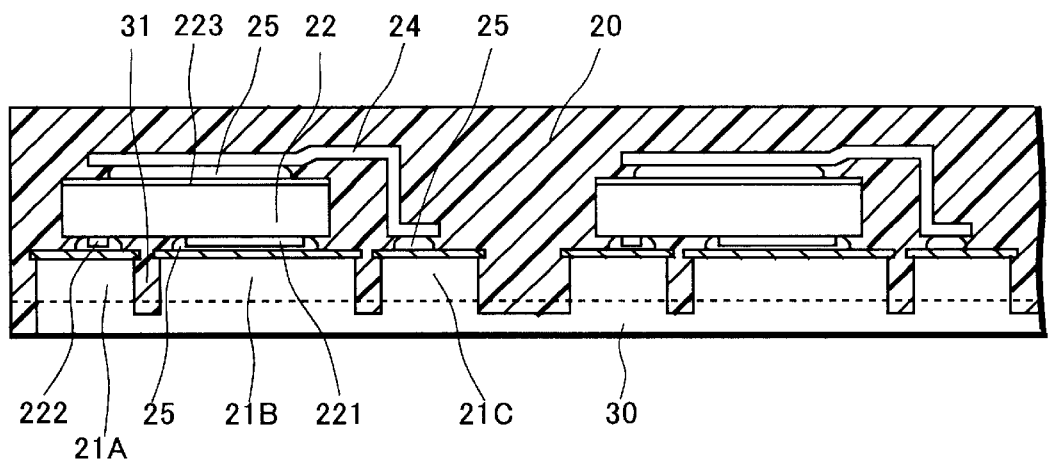
FIG. 28 is a cross-sectional view for explaining the manufacturing method of the MOSFET mounting structure of the invention.
Figure 29:
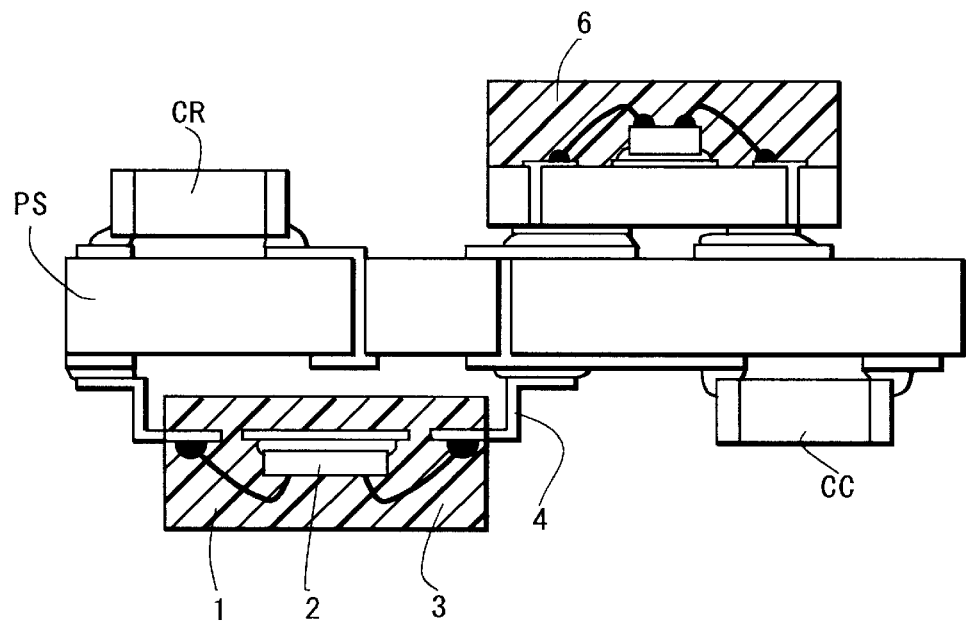
FIG. 29 is a cross-sectional view for explaining a mounting structure of the conventional circuit device.

Referring now to FIG. 23, a forth MOSFET mounting structure of the invention will be described below.

This mounting structure is substantially the same as that of FIG. 15, except that a conductive film 26 is formed on the surface of the conductive paths 21. Therefore, this conductive film 26 will be only described below.

A first feature is that the conductive film 26 is provided to prevent warp of the conductive paths and the MOSFET mounting structure.

Generally, owing to a difference in thermal expansion coefficient between the insulating resin and the material of the conductive paths (hereinafter referred to as a first material), the MOSFET mounting structure itself may be warped, or the conductive paths may be curved or exfoliated. Since the thermal conductivity of the conductive paths 21 is higher than that of the insulating resin, the conductive paths 21 are more likely to rise in temperature and expanded. Therefore, a second material having a smaller thermal expansion coefficient than the first material is covered to prevent curvature or exfoliation of the conductive paths, and warp of the MOSFET mounting structure. Particularly in the case where Cu is employed as the first material, the second material is preferably Au, Ni or Pt. The expansion coefficient of Cu is 16.7×10−6 (minus sixth power of 10); the expansion coefficient of Au is 14×10−6; the expansion coefficient of Ni is 12.8×10−6; and the expansion coefficient of Pt is 8.9×10−6.

A second feature is that an anchor effect is provided by the second material. A visor 27 is formed by the second material, and the visor 27 adhered with the conductive path 21 is buried into the insulating resin 20, so that the anchor effect is produced, thereby preventing slippage of the conductive paths 21.

Third Embodiment of Manufacturing Method of MOSFET Mounting Structure

A manufacturing method of the third MOSFET mounting structure will be described below with reference to FIGS. 15 to 22.

Figure 16:
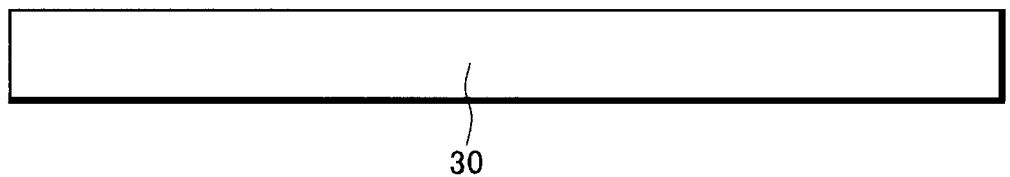
FIG. 16 is a cross-sectional view for explaining a manufacturing method of the MOSFET mounting structure of the invention.

First of all, a sheet conductive foil 30 is prepared as shown in FIG. 16. The material for this conductive foil 30 is chosen in consideration of the adhesion, bonding strength and plating property of the brazing material. This conductive foil 30 may be a conductive foil made of Cu as a principal material, a conductive foil made of Al as a principal material, or a conductive foil made of Fe—Ni alloy.

The thickness of the conductive foil is preferably about 10 to 300 $\mu$m in consideration of etching. Here, a copper foil having a thickness of 70 $\mu$m (2 ounces) was adopted. However, the conductive foil may be fundamentally over 300 $\mu$m or below 10 $\mu$m in thickness. As will be described later, it is necessary that a trench 31 shallower than the thickness of the conductive foil 30 may be formed.

The sheet conductive foil 30 rolled in a predetermined width may be prepared and carried in the ensuing steps, or the conductive foils cut in a predetermined size may be prepared and carried in the ensuing steps.

Subsequently, there is a step of removing the conductive foil 30 to be thinner than the thickness of the conductive foil 30, except for at least the region that becomes the conductive path 21. And there is a step of covering the insulating resin 20 on the trench 31 formed by the removing step and the conductive foil 30.

Figure 17:
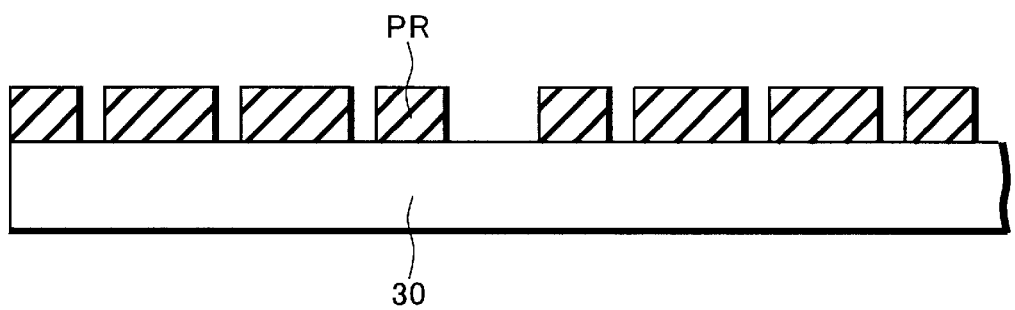
FIG. 17 is a cross-sectional view for explaining the manufacturing method of the MOSFET mounting structure of the invention.
Figure 18:
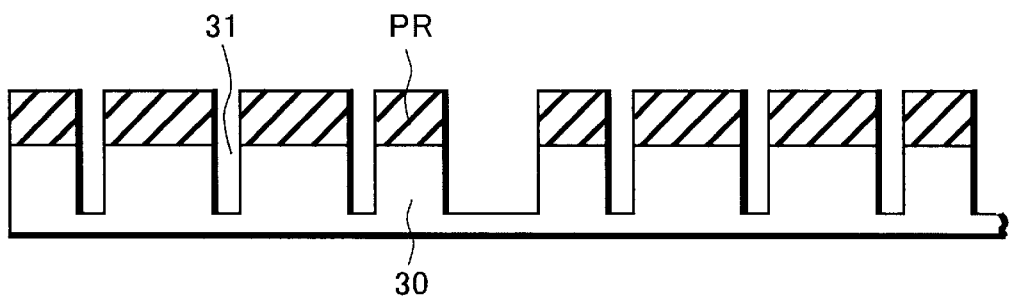
FIG. 18 is a cross-sectional view for explaining the manufacturing method of the MOSFET mounting structure of the invention.

Firstly, a photo-resist (anti-etching mask) PR is formed on the Cu foil 30, and patterned to make the conductive foil 30 exposed except for the region that becomes the conductive path 21 (see FIG. 17). Then the etching may be made via the photo-resist PR (see FIG. 18).

A trench 31 is formed by etching, for example, in a depth of 50 $\mu$m, and its side face is rough, so that the adhesive property with the insulating resin 20 is enhanced.

A side wall of the trench 31 is typically illustrated straightly, but has a different structure depending on the removing method. This removing step may be performed by wet etching, or dry etching. In the case of wet etching, the etchant may be ferric chloride or cupric chloride principally. The conductive foil is dipped in this etchant, or showered by this etchant. Herein, since the wet etching is typically isotropic etching, the trench 31 inward of the opening portion is broadened, so that the side face of the trench 31 has a curved structure.

In the case of the dry etching, the anisotropic or isotropic etching can be made. At present, it is said that Cu can not be removed by reactive ion etching, but can be removed by sputtering. The anisotropic or isotropic etching may be employed depending on the sputtering conditions.

In FIG. 17, a conductive film that is corrosion resistant to the etching solution may be selectively covered, instead of the photo-resist. If the conductive film is selectively covered on a portion that becomes the conductive path, this conductive film becomes an etching protective film, and the trench can be etched without the use of the resist. The materials for this conductive film may include Ag, Au, Pt and Pd. And the corrosion-resisting conductive film has a feature that it can be directly used as the die pad or bonding pad.

Figure 19:
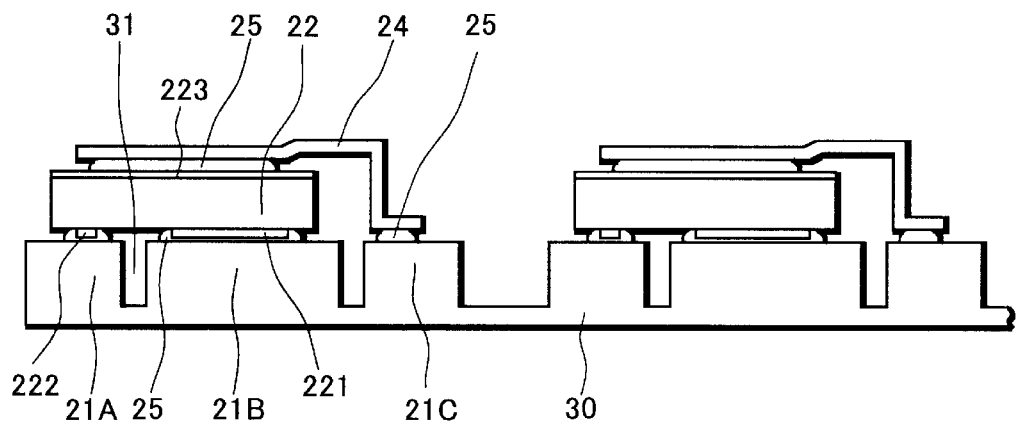
FIG. 19 is a cross-sectional view for explaining the manufacturing method of the MOSFET mounting structure of the invention.

After that, there is a step of mounting the MOSFET chip 22 on the conductive paths 21 composed of the conductive foil 30 and isolated by the trench 31, as shown in FIG. 19.

The MOSFET chip 22 may be the semiconductor bare chip having a source electrode 221 and a gate electrode 222 on the surface and a drain electrode 223 on the back face. The MOSFET chip 22 is subjected to pattern recognition by a chip mounter with the source electrode 221 and the gate electrode 222 faced down. Then, the source electrode 221 and the gate electrode 222 are placed into contact with the conductive paths 21B, 21A, respectively, and fixed in the flip chip method by using the brazing material such as solder or the conductive paste 25.

Also, the drain electrode 223 provided on the back face of the MOSFET chip 22 has one end of the metallic connecting plate 24 made of copper and bent like an L character connected by the brazing material such as solder or the conductive paste 25, the other end being connected to the conductive path 21C in the same manner. This metallic connecting plate 24 can be easily mounted in rough alignment, using a deformed component mounter, because the back side of the MOSFET chip 22 is only the back electrode 223 and there is no danger of causing the short-circuit with other electrodes.

Figure 20:
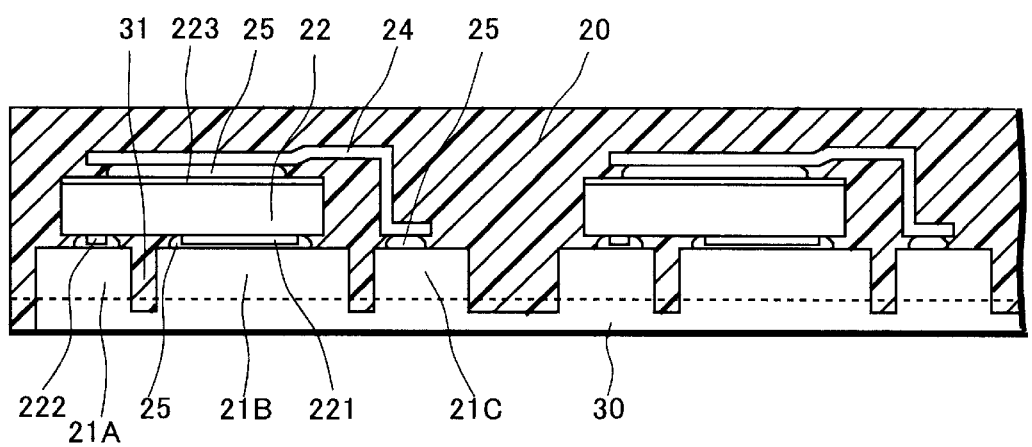
FIG. 20 is a cross-sectional view for explaining the manufacturing method of the MOSFET mounting structure of the invention.

Further, there is a step of attaching the insulating resin 20 to the conductive foil 30 and the trench 31, as shown in FIG. 20. This step is effected by transfer molding, injection molding, or dipping. The resin materials include the thermosetting resin such as epoxy resin which is subjected to transfer molding, and the thermoplastic resin such as polyimide resin or polyphenylene sulfide which is subjected to injection molding.

In this embodiment, the thickness of the insulating resin covered on the surface of the conductive foil 30 is adjusted to be about 100 μm from the top portion of the MOSFET chip. This thickness may be increased or decreased in consideration of the strength.

A feature of this step is that the conductive foil 30 which becomes the conductive paths 21 serves as a support substrate till the insulating resin 20 is covered. Conventionally, the support substrate was employed to form the conductive paths. However, in the present invention, the conductive foil 30 that becomes the support substrate is a required member as the electrode material. Therefore, there is the merit that the work can be done by omitting the constituent material as much as possible, and the costs can be reduced.

Since the trench 31 is shallower than the conductive foil, the conductive foil 30 is not separated individually as the conductive paths 21. Accordingly, the invention has a feature that the sheet conductive foil 30 can be handled as one piece, and particularly in molding the insulating resin, the work of carrying the conductive foil 30 to the mold, and attaching it on the mold is facilitated.

Subsequently, there is a step of removing the back face of the conductive foil 30 chemically and/or physically to separate the conductive paths 21. This removing step is performed by polishing, grinding, etching or metal evaporation of laser.

In the experiments, the overall surface of the conductive foil 30 is ground about 30 μm thick by the polishing apparatus or grinding apparatus, with the insulating resin 20 exposed from the trench 31. This exposed face is indicated by the dotted line in FIG. 20. As a result, the conductive paths 21 having a thickness of about 40 μm are separated. Also, the overall surface of the conductive foil 30 may be wet etched, just before the insulating resin 20 is exposed, and then polished or ground by the polishing or grinding apparatus to expose the insulating resin 20. Further, the overall surface of the conductive foil 30 may be wet etched up to the position indicated by the dotted line (in FIG. 20), thereby exposing the insulating resin 20.

Consequently, the surface of the conductive paths 21 is exposed from the insulating resin 20. And the trench 31 is ground to produce the trench 23 as shown in FIG. 15 (see FIG. 20).

Lastly, a conductive material such as solder is covered on the exposed conductive paths 21 which are exposed from the base face of the insulating resin 20, to complete a MOSFET mounting structure.

In the case where a conductive film is applied on the back face of the conductive paths 21, the conductive film may be formed in advance on the back face of the conductive foil of FIG. 16. In this case, the conductive film may be selectively applied on a portion corresponding to the conductive path. The applying method may be made by plating, for example. This conductive film should be made of a material that is resistant to etching. In the case where the conductive film is employed, the conductive paths 21 can be separated only by etching, without polishing.

Figure 21:
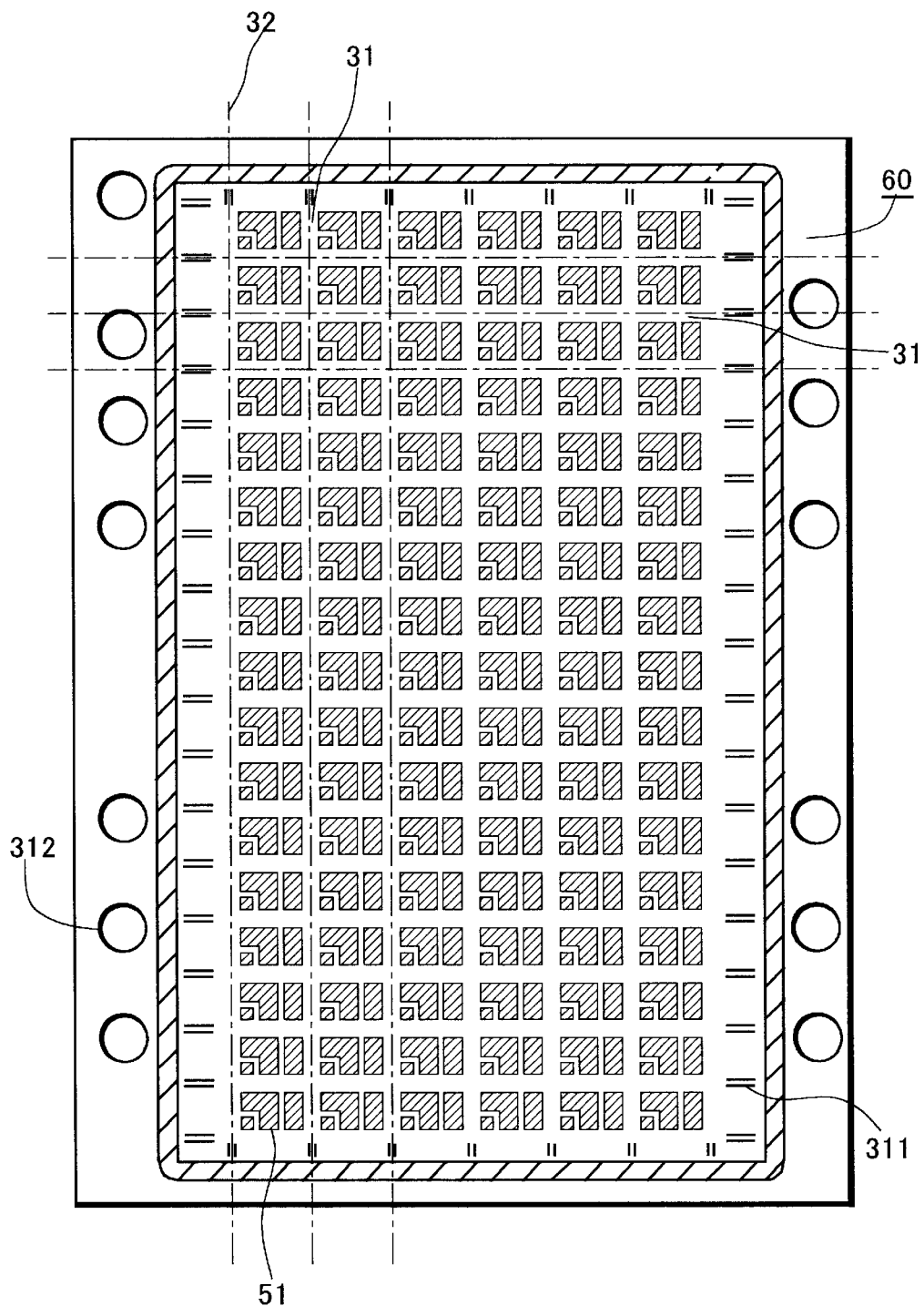
FIG. 21 is a plan view for explaining the manufacturing method of the MOSFET mounting structure of the invention.

With this manufacturing method, a number of MOSFET chips 22 are mounted like a matrix on the conductive foil 30, as shown in FIG. 21. Accordingly, the insulating resin 20 is severed in the X axis and Y axis directions along the dicing line 32 indicated by the dot-and-chain line in FIG. 21, using a dicing apparatus, so that the MOSFET mounting structures are separated individually.

With the above manufacturing method, the conductive paths 21 are buried into the insulating resin 20, and the MOSFET mounting structure can be produced in which the back face of the insulating resin 20 is substantially flush with the back face of the conductive paths 21.

This manufacturing method has a feature that the insulating resin 20 is utilized as the support substrate, allowing the separation work of the conductive paths 21. The insulating resin 20 is a material required for burying the conductive paths 21, and can dispense with the support substrate as required in the conventional manufacturing method. Accordingly, the MOSFET mounting structure can be manufactured with a minimum amount of material at the reduced costs.

The thickness of the insulating resin from the surface of the conductive paths 21 can be adjusted at the previous step of attaching the insulating resin. In the present invention, the MOSFET chip 22 is fixed on the conductive paths 21 in the flip chip method, and the bonding wire can be eliminated. Accordingly, the thickness of MOSFET mounting structure mounting the MOSFET chip 22 can be made very thin, depending on the thickness of the MOSFET chip 22 to be mounted. Herein, the MOSFET mounting structure is produced in which both of the conductive paths 21 having a thickness of 40 μm and the MOSFET chip 22 are buried into the insulating resin 20 having a thickness of about 400 μm (see FIG. 15).

FIG. 21 is a plan view of a substrate of the conductive foil 30 after the trench 31 is formed. This substrate is as large as 45 mm×60mm. The conductive paths 21 are indicated by the black part, and the trenches 31 are indicated by the white part. Accordingly, the MOSFET mounting structures are arranged like a matrix of 6 rows and 17 lines, an alignment mark 311 and an index pore 312 for use during the manufacture being provided on the marginal portion. For example, the dicing line 32 is defined through the center of two lines of the alignment mark 311 provided at both marginal areas.

Figure 22A:
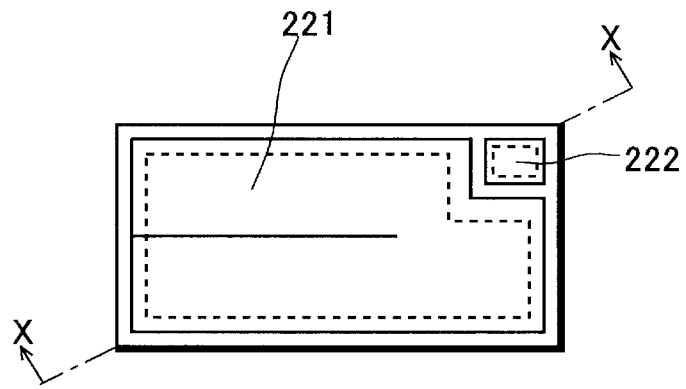
FIGS. 22A–B is a plan view and a cross-sectional view for explaining the manufacturing method of the MOSFET mounting structure of the invention.
Figure 22B:
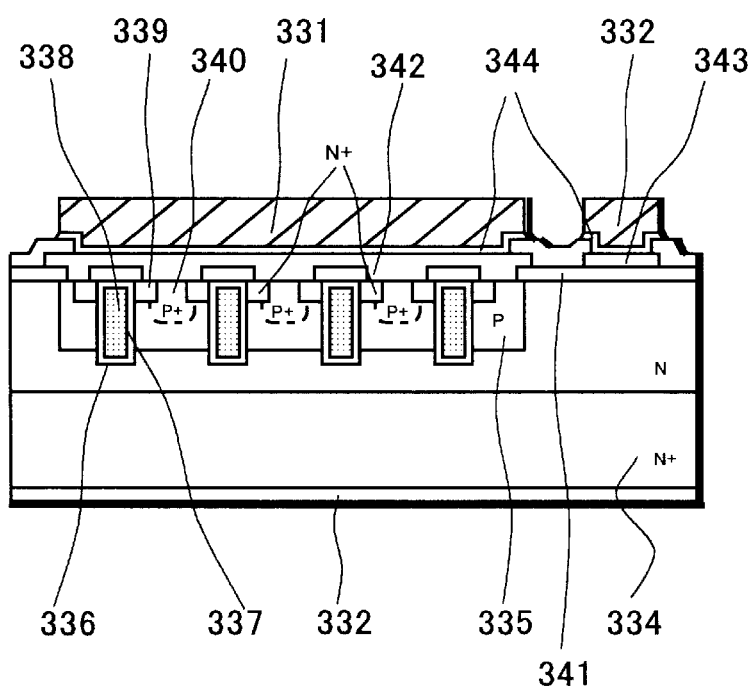

FIG. 22B is a cross-sectional view of a specific structure of the MOSFET chip 22. FIG. 22A is a plan view of the MOSFET chip structure and FIG. 22B is a cross-sectional view of that structure taken along the line X—X in FIG. 22A. The MOSFET chip 22 has an N+-type/N-type semiconductor substrate 224 that serves as a drain region, a P-type channel region 225, a trench 226 penetrating through the channel region 225, a gate electrode 228 made of polycrystalline silicon and buried via a gate oxide film 227 into the trench 226, an N+-type source region 229 adjacent to the trench 226, and a P+-type body region 230 forming a substrate diode and adjacent to the source region 229. On an insulating film 231 of the semiconductor substrate 224, there are provided an underlying source electrode 232 formed by sputtering of aluminum that is in contact with the source region 229 and the body region 230, and an underlying gate electrode 233 connected to the gate electrode 228. On this underlying source electrode 232 and the underlying gate electrode 233, a barrier metal layer 234 of Pd/Ti or Au/TiW is provided. And a source electrode 221 and a gate electrode 222 having a bump formed of a gold plated layer are provided about 25 μm thick thereon. Also, a drain electrode 223 is provided by deposition of Au/Cr over the back face of the semiconductor substrate 224. The source electrode 221 is provided almost entirely over the semiconductor substrate 224, and the gate electrode 222 is provided at a corner portion of the semiconductor substrate 224, these electrode being brought into contact with the corresponding conductive paths 21B, 21A, as will be apparent from FIG. 22A.

The source electrode 221 and the gate electrode 222 may be a solder electrode with the brazing material such as solder attached to the conductive ball, or because the conductive paths 21 are electrically isolated, the source electrode 221 and the gate electrode 222 may not be a protruding electrode but a normal flat electrode that can be soldered.

Forth Embodiment of Manufacturing Method of MOSFET Mounting Structure

Referring now to FIGS. 23 to 28, a manufacturing method of a MOSFET mounting structure having a visor 27 will be described below. The fourth embodiment is substantially the same as the first embodiment, except that the second material 40 for forming the visor is attached, and is not described in detail.

First of all, a conductive foil 30 composed of a first material having a second material 40 of small etching rate applied thereon is prepared.

For example, if Ni is applied on the Cu foil, Cu and Ni formed of the Cu are etched at the same time by ferric chloride or cupric chloride, and conveniently, owing to a difference between etching rates, Ni is formed to be a visor 27. The bold solid line indicates a conductive film 40 made of Ni, its film thickness being preferably about 1 to 10 μm. As the Ni film thickness is larger, the visor 27 is more likely to form.

As the second material, a material which can be selectively etched with the first material, may be used. In this case, a film made of the second material is patterned to cover the formation region of the conductive paths 21, and using the patterned film as a mask, a film made of the first material is etched, so that the visor 27 can be formed. The second materials may include Al, Ag, and Au (see FIG. 24).

Subsequently, there is a step of removing the conductive foil 30 excluding at least the region that becomes the conductive paths 21 to be less than the thickness of the conductive foil 30.

A photo-resist PR is formed on the Ni conductive film, and patterned to expose the Ni conductive film 40 excluding the region that becomes the conductive paths 21. Then the etching is made via the photo-resist.

If the etching is made using the etchant of ferric chloride or cupric chloride, as previously described, the visor 27 is protruded as the etching progresses, because the etching rate of Ni conductive film 40 is smaller than that of the conductive film Cu 30.

A step of mounting a MOSFET chip 22 on the conductive foil 30 formed with the trench 31 (FIG. 27), a step of covering the conductive foil 30 and the trench 31 with the insulating resin 20 and removing the back face of the conductive foil 30 chemically and/or physically to separate the conductive paths 21 (FIG. 28), and a step of forming the conductive film on the back face of the conductive paths to complete the MOSFET mounting structures (FIG. 23) are the same as those of the previous manufacturing method, and are not described here.

As described above, with the present invention, a MOSFET mounting structure is constituted of a minimum amount of a MOSFET chip, the conductive paths, a metallic connecting plate and insulating resin, without wasting resources. Hence, the MOSFET mounting structure can be realized without expense of extra constituent elements up to completion, and with the reduced costs.

Since a MOSFET chip is directly fixed on the conductive paths in a flip chip method, the lead-out resistance particularly from the source electrode to the conductive paths can be eliminated, and the on resistance can be 30% lower than that of the conventional mounting structure.

In the MOSFET mounting structure of the invention, the bonding wire can be unnecessary. By optimizing the film thickness of the insulating resin and the thickness of the conductive foil, the MOSFET mounting structure can be very thin with a height of 0.5 mm or less, and reduced in size and weight.

Since the back face of the conductive paths is only exposed from the insulating resin, there is the advantage that the back face of the conductive paths can be directly connected to the outside, so that the back electrode and the through hole of the conventional structure can be dispensed with.

Also, this MOSFET mounting structure has such a structure that the surface of the trench is substantially flush with the surface of the conductive paths. Since the MOSFET mounting structure itself can be moved horizontally owing to a surface tension of the solder in mounting QFP at narrow pitches, the correction for lead dislocation can be effected easily.

Since the second material is formed on the surface of the conductive paths, it is possible to prevent warp of the mounting board, particularly curvature or exfoliation of the slender interconnect, which may be caused owing to a difference between thermal expansion coefficients.

By forming a film of the second material on the surface of the conductive paths, a visor adherent with the conductive path can be formed. Hence, it is possible to develop an anchor effect, and prevent the warp or slippage of the conductive paths.

With a manufacturing method of the MOSFET mounting structure of the present invention, the conductive foil itself to make the conductive paths is employed as a support substrate, acting to support the whole circuit up to the steps of forming the trench, mounting the MOSFET chip, and covering the insulating resin, and at a step of dividing the conductive foil into individual conductive paths, the insulating resin is employed as the support substrate. Accordingly, the MOSFET mounting structure can be fabricated of a minimum amount of the MOSFET chip, the conductive foil, and insulating resin. Since the support substrate is unnecessary, the conductive paths are buried into the insulating resin, the thickness of insulating resin and the thickness of conductive paths can be adjusted, and the bonding wire is not required, there is the merit that a very thin MOSFET mounting structure can be produced.

Since the conductive paths can be handled without separating them up to the step of removing the conductive foil (so as to form a trench) to be less than its thickness (e.g., half-etching), the conductive foil has a good supportability, can have a high positional accuracy and have a good bonding ability. Further many MOSFET mounting structures can be integrated on a small substrate, resulting in the enhanced workability.

Since the conductive paths form a plane flush with the insulating resin, the MOSFET mounting structure can be shifted without abutting against the side face of the conductive paths on the mounting board. In particular, if the MOSFET mounting structure has been dislocated, it can be shifted horizontally and rearranged. If the brazing material is molten after mounting the MOSFET mounting structure, the MOSFET mounting structure dislocated tends to get back to the upper portion of the conductive paths, owing to a surface tension of the molten brazing material, so that the MOSFET mounting structure itself can be rearranged.

What is claimed is:

1. A circuit device comprising:
   a plurality of conductive paths that are electrically isolated;
   a circuit element having a front electrode fixed on a desired conductive path;
   a metal connecting plate for connecting a back electrode of said circuit element with a desired conductive path; and
   an insulating resin for covering said circuit element and integrally supporting said conductive paths.

2. A circuit device according to claim 1, wherein said plurality of conductive paths are electrically isolated by a trench, and said insulating resin for covering said circuit element is filled in said trench between said conductive paths to integrally support said conductive paths.

3. The circuit device according to claim 2, wherein a back face of said conductive paths is made substantially flush with a back face of the insulating resin being filled in said trench between said conductive paths.

4. A circuit device according to claim 1, wherein said plurality of conductive paths are electrically isolated by a trench, and said insulating resin for covering said circuit elements is filled in said trench between said conductive paths to integrally support said conductive paths, with only the back face of said conductive paths exposed.

5. The circuit device according to claim 1, wherein said conductive paths are composed of a conductive foil made of copper, aluminum or iron-nickel.

6. The circuit device according to claim 5, wherein a conductive film made of a metal material different from that of said conductive paths is provided on an upper face of said conductive paths.

7. The circuit device according to claim 6, wherein said conductive film is plated with nickel, gold or silver.

8. The circuit device according to claim 1, wherein said circuit element is composed of a semiconductor bare chip.

9. The circuit device according to claim 8, wherein said circuit element is composed of a transistor.

10. The circuit device according to claim 1, wherein said semiconductor chip is a power MOSFET chip having a gate electrode and a source electrode fixed on the desired conductive paths, a metal connecting plate for connecting a drain electrode of said power MOSFET with a desired conductive path, and an insulating resin for covering said power MOSFET chip and integrally supporting said conductive paths.

* * * * *